United States Patent
Hou et al.

(10) Patent No.: US 12,148,791 B2
(45) Date of Patent: Nov. 19, 2024

(54) SEMICONDUCTOR STRUCTURES HAVING DEEP TRENCH CAPACITOR AND METHODS FOR MANUFACTURING THE SAME

(71) Applicant: NANYA TECHNOLOGY CORPORATION, New Taipei (TW)

(72) Inventors: Szu-Yu Hou, New Taipei (TW); Li-Han Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/219,247

(22) Filed: Jul. 7, 2023

(65) Prior Publication Data
US 2024/0063255 A1 Feb. 22, 2024

Related U.S. Application Data

(62) Division of application No. 17/888,749, filed on Aug. 16, 2022.

(51) Int. Cl.
*H10B 12/00* (2023.01)
*H01L 49/02* (2006.01)

(52) U.S. Cl.
CPC .............. *H01L 28/75* (2013.01); *H01L 28/91* (2013.01); *H01L 28/92* (2013.01); *H10B 12/01* (2023.02);
(Continued)

(58) Field of Classification Search
CPC ... H01L 28/90–92; H01L 28/75; H10B 12/01; H10B 12/033; H10B 12/0387
See application file for complete search history.

(56) References Cited

U.S. PATENT DOCUMENTS

| | | | |
|---|---|---|---|
| 6,306,772 B1 | 10/2001 | Lin et al. | |
| 2013/0271938 A1* | 10/2013 | Lindert | H10B 12/033 361/782 |
| 2022/0059647 A1 | 2/2022 | Zhang et al. | |

FOREIGN PATENT DOCUMENTS

| CN | 107689362 A | 2/2018 |
| TW | 200903727 A | 1/2009 |
| TW | 201724532 A | 7/2017 |

OTHER PUBLICATIONS

Office Action and Search Report dated on Mar. 11, 2024 related to Taiwanese Application No. 112109169.
(Continued)

*Primary Examiner* — Jose R Diaz
(74) *Attorney, Agent, or Firm* — Xuan Zhang

(57) ABSTRACT

A semiconductor structure and a method for forming the same are provided. The semiconductor structure includes a substrate having a first surface, a plurality of layers disposed on the first surface of the substrate. The plurality of layers includes a first nitride layer disposed on the first surface of the substrate, a first silicon-containing layer disposed on the first nitride layer, an intermediate nitride layer disposed on the first silicon-containing layer, a second silicon-containing layer disposed on the intermediate nitride layer, and a second nitride layer disposed on the second silicon-containing layer. In addition, the semiconductor structure includes a trench capacitor penetrating the plurality of layers and in contact with the substrate. The trench capacitor has a first portion having a first lateral surface and a second portion having a second lateral surface, and the first lateral surface has a slope different from that of the second lateral surface.

7 Claims, 17 Drawing Sheets

(52) U.S. Cl.
CPC ....... *H10B 12/033* (2023.02); *H10B 12/0387* (2023.02); *H10B 12/31* (2023.02)

(56) References Cited

OTHER PUBLICATIONS

Office Action and Search Report dated on May 10, 2024 related to Taiwanese Application No. 112109169.

* cited by examiner

SEMICONDUCTOR STRUCTURES HAVING DEEP TRENCH CAPACITOR AND METHODS FOR MANUFACTURING THE SAME

CROSS-REFERENCE TO RELATED APPLICATION

This application is a divisional application of U.S. Non-Provisional application Ser. No. 17/888,749 filed 16 Aug. 2022, which is incorporated herein by reference in its entirety.

TECHNICAL FIELD

The present disclosure relates to a semiconductor structure and a method of manufacturing the same, and more particularly, to a semiconductor device having a deep trench capacitor and a method of manufacturing the same.

DISCUSSION OF THE BACKGROUND

Capacitors are used in a wide variety of semiconductor devices, for example in DRAM (dynamic random access memory) devices or any other type of memory device. DRAM memory devices are manufactured by replicating millions of identical circuit elements, known as DRAM cells, on a single semiconductor wafer. A DRAM cell is an addressable location that can store one bit (binary digit) of data. In general, a DRAM cell includes a storage capacitor, normally a trench capacitor. When the trench capacitor has a great height and a short width, the bottom portion of the trench capacitor would have a small width. The small width of the trench capacitor tends to lead to lower capacitance value and weak structure.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a substrate having a first surface, a plurality of layers disposed on the first surface of the substrate. The plurality of layers includes a first nitride layer disposed on the first surface of the substrate, a first silicon-containing layer disposed on the first nitride layer, an intermediate nitride layer disposed on the first silicon-containing layer, a second silicon-containing layer disposed on the intermediate nitride layer, and a second nitride layer disposed on the second silicon-containing layer. In addition, the semiconductor structure includes a trench capacitor penetrating the plurality of layers and in contact with the substrate. The trench capacitor has a first portion having a first lateral surface and a second portion having a second lateral surface, and the first lateral surface has a slope different from that of the second lateral surface.

Another aspect of the present disclosure provides a method for forming a semiconductor structure. The method includes providing a substrate. The method includes forming a plurality of layers on the substrate, where the plurality of layers include a first nitride layer on the substrate, a first silicon-containing layer on the first nitride layer, an intermediate layer on the first silicon-containing layer, a second silicon-containing layer on the intermediate layer, and a second nitride layer on the second silicon-containing layer. The method also includes performing a first removal operation on the plurality of layers to form a trench, which penetrates the first nitride layer, the first silicon-containing layer, the intermediate layer, the second silicon-containing layer, and the second nitride layer. The trench includes a first portion surrounded by the first silicon-containing layer and a second portion surrounded by the second silicon-containing layer. The method further includes performing a second removal operation on the plurality of layers to expand the first portion of the trench.

Another aspect of the present disclosure provides a semiconductor structure. The semiconductor structure includes a substrate, a multilayered stack disposed on the substrate. The multilayered stack includes a first nitride layer disposed on the substrate, a first silicon-containing layer disposed on the first nitride layer, an intermediate nitride layer disposed on the first silicon-containing layer, a second silicon-containing layer disposed on the intermediate nitride layer, and a second nitride layer disposed on the second silicon-containing layer. In addition, the semiconductor structure includes a trench capacitor penetrating the plurality of layers and in contact with the substrate. The trench capacitor has a first portion and a second portion. The first portion has a uniform width, and the second portion has a first width adjacent to the intermediate nitride layer and a second width adjacent to the second nitride layer. Wherein the second width is greater than the first width.

The disclosure provides a semiconductor structure of the memory device. In current practice, deep trench capacitors of the semiconductor structure may present a top width exceeding a bottom width, wherein the deep trench tapers from the top to the bottom, limiting space at the bottom. Such structure can lead to lower capacitance value or weak structure. The subject disclosure provides a method of protecting the upper portion of the trench so that the lower portion of the trench can be widened. As the lower portion of the trench is widened, the lower portion of the trench can have a uniform width, and the upper can have increased width. Accordingly, the trench can have a relatively uniform overall width. As a result, the improved deep trench capacitor can increase capacitance with a more stable structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
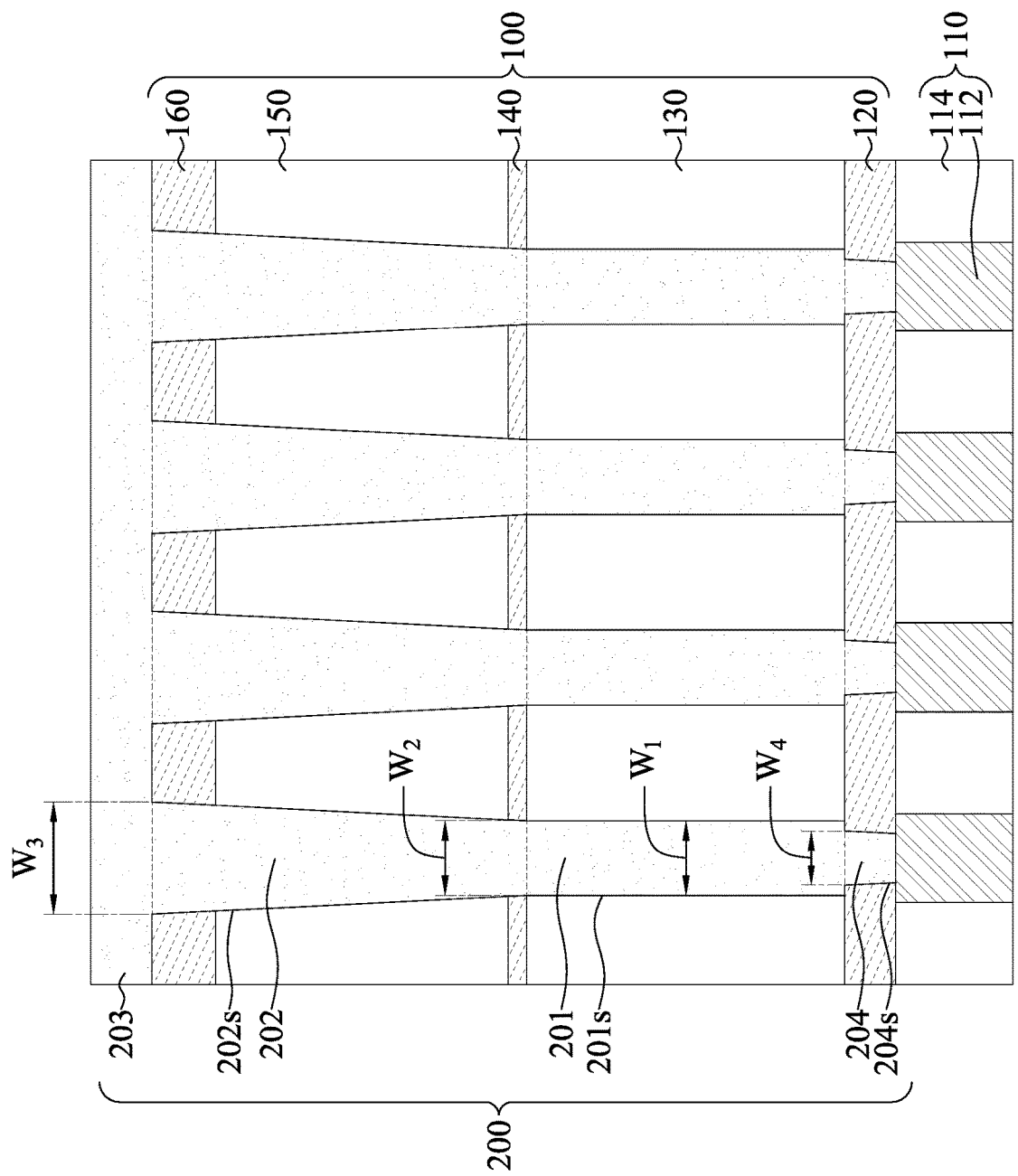
FIG. 1 is a cross-section of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a cross-section of a semiconductor structure 10, in accordance with some embodiments of the present disclosure.

The semiconductor structure 10 includes a substrate 110, a multilayered stack 100, and a trench capacitor 200. In one embodiment, the substrate 110 can include one or more conductive regions 112. The multilayered stack 100 includes nitride layers 120, 140, and 160, and silicon-containing layers 130 and 150.

Referring to FIG. 1, the substrate 110 includes a conductive region 112 and an isolation layer 114 adjacent to the conductive region 112. In some embodiments, the conductive region 112 can be embedded in the isolation layer 114. In one embodiment, the conductive region 112 has an upper surface level with the isolation layer 114. The conductive region 112 can be exposed by the isolation layer 114. For example, the upper surface of the conductive region 112 can be exposed by the upper surface of the isolation layer 114. In some embodiments, the conductive region 112 can have a height identical to that of the isolation layer 114. In another embodiment, the height of the conductive region 112 can be different from that of the isolation layer 114. For example, the height of the conductive region 112 can be less than the height of the isolation layer 114.

In some embodiments, the conductive region 112 can include a conductive material, such as metal. For example, the conductive region 112 can be of tungsten (W). In some embodiments, the isolation layer can be oxide, such as silicon oxide or other suitable material.

The multilayered stack 100 can be a dielectric layered stack. The multilayered stack 100 includes nitride layers 120, 140, and 160, and silicon-containing layers 130 and 150. The nitride layer 120 can be disposed on the substrate 110. The silicon-containing layer 130 can be disposed on the nitride layer 120. The nitride layer 140 can be disposed on the silicon-containing layer 130. The silicon-containing layer 150 can be disposed on the nitride layer 140. The nitride layer 160 can be disposed on the silicon-containing layer 150.

In detail, the nitride layer 120, the silicon-containing layer 130, the nitride layer 140, the silicon-containing layer 150, and the nitride layer 160 are formed in sequence over the substrate 110. In other words, forming the nitride layer 140 over the silicon-containing layer 130 is performed such that the silicon-containing layer 130 is between the nitride layer 120 and the nitride layer 140, and forming the nitride layer 160 over the silicon-containing layer 150 is performed such that the silicon-containing layer 150 is between the nitride layer 140 and the nitride layer 160. In some embodiments, the nitride layer 120 can contact the conductive region 112 and the isolation layer 114 of the substrate 110. In some embodiments, the multilayered stack 100 subsequently undergoes planarization, such as CMP (chemical-mechanical polishing).

In some embodiments, the nitride layers 120, 140, and 160 can be of the same material. For example, the material of the nitride layers 120, 140, and 160 can include silicon nitride (SiN). In some embodiments, the silicon-containing layers 130 and 150 can be of different materials. The silicon-containing layer 130 may include boron (B), phosphorus (P), or a combination thereof. For example, the silicon-containing layer 130 is made of borophosphosilicate glass (BPSG). In some embodiments, the silicon-containing layer 150 can include silane oxide. For example, the silicon-containing layer 150 can be of tetraethoxysilane (TEOS).

Referring to FIG. 1, the trench capacitor 200 can penetrate the multilayered stack 100 and contact the substrate 110. In some embodiments, the trench capacitor 200 can be disposed on the substrate 110. In another embodiment, the trench capacitor 200 can be disposed on the multilayered stack 100.

The trench capacitor 200 can include portions 201, 202, 203, and 204. The portion 201 of the trench capacitor 200 can be surrounded by the silicon-containing layer 130. In one embodiment, the portion 201 can be partially surrounded by the nitride layer 140. In another embodiment, the portion 201 can be partially surrounded by the nitride layer 120. In some embodiments, the portion 201 can contact the silicon-containing layer 130. The portion 201 can contact the nitride layer 120. The portion 201 can contact the nitride layer 140. In some embodiments, the portion 201 can have a uniform width W1. In some embodiments, the portion 201 of the trench capacitor 200 may be cylindrical. That is, the width W1 can be the diameter of the portion 201.

The portion 202 of the trench capacitor 200 can be surrounded by the silicon-containing layer 150. In one embodiment, the portion 202 can be partially surrounded by the nitride layer 160. In another embodiment, the portion 202 can be partially surrounded by the nitride layer 140. In some embodiments, the portion 202 can contact the silicon-containing layer 150. The portion 202 can contact the nitride layer 140. The portion 202 can contact the nitride layer 160. In some embodiments, the portion 202 may taper from the nitride layer 160 toward the nitride layer 120. In some embodiments, the portion 202 has a width decreasing toward the nitride layer 120. An interface between the portion 201 and the portion 202 can have a width W2.

The width W2 of the portion 202 can be located at an interface between the silicon-containing layer 150 and the nitride layer 140. In some embodiments, the width W2 can be the minimum width of the portion 202. In some embodiments, the width W2 can be different from the width W1 of portion 201. For example, the width W2 can be less than the width W1. Or, the width W2 can be greater than the width W1. In some embodiments, the width W2 may be substantially identical to the width W1 of the portion 201.

In some embodiments, the portion 202 may have a width W3 adjacent to the portion 203. The width W3 can be at an interface between the portion 202 and the portion 203. The width W3 of the portion 202 can be the maximum width of the portion 202. In some embodiments, the width W3 can be different from the width W2. For example, the width W3 can be greater than the width W2. In some embodiments, the width W3 can be identical to the width W2.

Referring to FIG. 1, the portion 201 has a side surface 201s and the portion 202 has a side surface 202s. The side surface 201s can have a slope different from that of the side surface 202s. In some embodiments, the side surface 201s can be substantially perpendicular to the substrate 110. In other words, the side surface 201s is vertical. Accordingly, the slope of the side surface 201s can be undefined. In some embodiments, the slope of the side surface 202s can approach the slope of the side surface 201s. That is, the slope of the side surface 202s can have an extremely high absolute value.

The portion 203 of the trench capacitor 200 can be disposed on the multilayered stack 100. In some embodiments, the portion 203 can contact the nitride layer 160. The portion 203 can be disposed on the nitride layer 160. In some embodiments, the portion 203 can be adjacent to the portion 202. The portion 203 can be disposed on the portion 202. In some embodiments, the trench capacitor 200 is a deep trench structure. For example, the ratio of a height of the trench capacitor 200 to the width thereof (such as the width W3) exceeds 25.

The portion 204 of the trench may be adjacent to the portion 201. In some embodiments, the portion 204 can be located under the portion 201. That is, the portion 201 can be disposed between the portion 202 and the portion 204. In some embodiments, the portion 204 may taper in a direction from the nitride layer 160 toward the substrate 100. In some embodiments, the portion 204 has a width decreasing toward the substrate 100. The portion 204 can have a width W4 at an interface between the portion 201 and the portion 204. In some embodiments, the width W4 can be different from the width W1. For example, the width W4 can be less than the width W1.

In one embodiment, a side surface 204s of the portion 204 can be vertical. In other words, the side surface 204s can be vertical. Accordingly, the slope of the side surface 204s may be undefined. In another embodiment, the side surface 204s may have a slope identical to that of the side surface 202s. For example, the side surface 204s can be parallel to the side surface 202s.

Figure 1A:
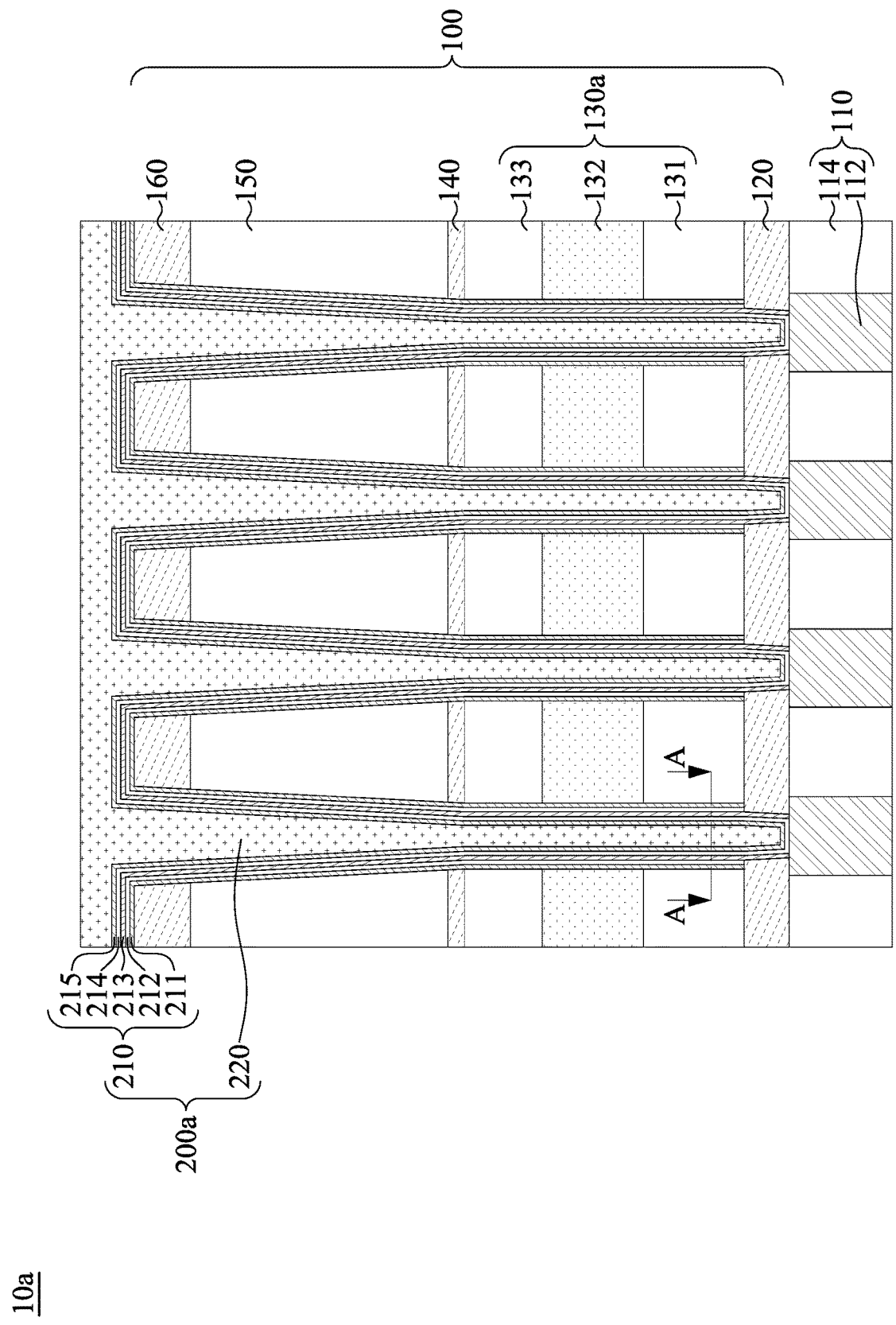
FIG. 1A is a cross-section of a semiconductor structure, in accordance with some embodiments of the present disclosure.

FIG. 1A is a cross-section of a semiconductor structure 10a, in accordance with some embodiments of the present disclosure, in which the semiconductor structure 10a is similar to the semiconductor structure 10 in FIG. 1, differing therefrom in that in FIG. 1A, the silicon-containing layer 130a can have portions 131, 132, and 133, and the trench capacitor 200a can includes a multilayered stack 210 and a contact 220. The multilayered stack 210 of the trench capacitor 200a can include conductive layers 211, 213, and 215 and dielectric layers 212 and 214.

In some embodiments, the silicon-containing layer 130a may include one or more regions. For example, the silicon-containing layer 130a can include regions 131, 132, and 133. The region 131 of the silicon-containing layer 130a can be disposed on the nitride layer 120. The region 132 can be adjacent to the region 131. In some embodiments, the region 132 can be disposed on the region 131. The region 133 can be adjacent to the region 132. In some embodiments, the region 133 can be disposed on the region 132.

The region 131 can have a thickness different from that of region 132. For example, the thickness of the region 131 can be greater than that of the region 132. In some embodiments, the thickness of the region 131 can substantially identical to that of the region 132. That is, the thickness of the region 131 can be equal to or greater than that of the region 132. In one embodiment, the region 132 can have a thickness different from a thickness of the region 133. For example, the thickness of the region 132 can be greater than that of the region 133. In some embodiments, the thickness of the region 132 can substantially identical to that of the region 133. That is, the thickness of the region 132 can be equal to or greater than that of the region 133. In some embodiments, the thickness of the region 131 can be equal to that of the region 132 and exceeding that of the region 133.

In some embodiments, the regions 131, 132, and 133 can have different doping concentrations. The doping concentration of the region 131 can be different from the doping concentration of the region 132. For example, the doping concentration of the region 131 can be less than the doping concentration of the region 132. In some embodiments, the doping concentration of the region 132 can be different from the doping concentration of the region 133. For example, the doping concentration of the region 132 can be less than the doping concentration of the region 133. Accordingly, the doping concentration of the region 133 may be greater than that of the region 131. In some embodiments, the region 133 can have a boron (B) concentration greater than that of regions 131 and 132. In some embodiments, the region 133 can have a phosphorus (P) concentration exceeding that of regions 131 and 132. In some embodiments, the region 133 can have a B/P concentration greater than the regions 131 and 132.

Referring to FIG. 1A, the multilayered stack 210 of the trench capacitor 200a can penetrate the multilayered stack 100. In other words, the multilayered stack 210 can penetrate the nitride layer 160, the silicon-containing layer 150, the nitride layer 140, the silicon-containing layer 130a, and the nitride layer 120. The multilayered stack 210 can be disposed in a trench penetrating the multilayered stack 100 and in contact with the substrate 110. In some embodiments, the multilayered stack 210 can cover a lateral surface of the nitride layer 160, the silicon-containing layer 150, the nitride layer 140, the silicon-containing layer 130a, and the nitride layer 120. The multilayered stack 210 can define a trench corresponding to the trench of the multilayered stack 100.

A portion of the conductive layer 211 of the multilayered stack 210 can be disposed on the nitride layer 160. In some embodiments, the conductive layer 211 can be disposed adjacent to the nitride layer 160, the silicon-containing layer 150, the nitride layer 140, and the silicon-containing layer 130a. The conductive layer 211 can cover a lateral surface of the nitride layer 160, the silicon-containing layer 150, the nitride layer 140, and the silicon-containing layer 130a. In some embodiments, the conductive layer 211 can contact the nitride layer 120. The conductive layer 211 may have an underside coplanar with the top surface of the nitride layer 120.

The dielectric layer 212 of the multilayered stack 210 can be disposed on the conductive layer 211. In some embodiments, the dielectric layer 212 can disposed on the nitride layer 160. The dielectric layer 212 can cover a lateral surface of the conductive layer 211. In some embodiments, the dielectric layer 212 can contact the nitride layer 120. The dielectric layer 212 may have an underside coplanar with the top surface of the nitride layer 120. In some embodiment, the underside of the dielectric layer 212 can be coplanar with the underside of the conductive layer 211.

A portion of the conductive layer 213 of the multilayered stack 210 can be disposed on the nitride layer 160. In some embodiments, the conductive layer 213 can be disposed on the dielectric layer 212. The conductive layer 213 can cover a lateral surface of the dielectric layer 212. In some embodiments, the conductive layer 213 can cover a lateral surface of the nitride layer 120. In some embodiments, the conductive layer 213 can contact the substrate 110. In some embodiments, the conductive layer 213 can contact the conductive region 112 exposed from the isolation layer 114. The conductive layer 213 may have an underside coplanar with the top surface of the conductive region 112 of the substrate 110. In some embodiments, the bottom layer of the conductive layer 213 can be lower than the underside of the dielectric layer 212.

A portion of the dielectric layer 214 of the multilayered stack 210 can be disposed on the nitride layer 160. In some embodiments, the dielectric layer 214 can be disposed on the conductive layer 213. The dielectric layer 214 can cover a lateral surface of the conductive layer 213. In some embodiments, the dielectric layer 214 can contact the substrate 110. In some embodiments, the dielectric layer 214 can contact the conductive region 112 exposed from the isolation layer 114. In some embodiments, the dielectric layer 214 can be disposed on the substrate 110. The dielectric layer 214 may have an underside coplanar with the top surface of the conductive region 112 of the substrate 110. In some embodiments, the bottom layer of the dielectric layer 214 can be coplanar with the underside of the conductive layer 213. In some embodiments, the bottom layer of the dielectric layer 214 can be lower than the underside of the dielectric layer 212.

A portion of the conductive layer 215 of the multilayered stack 210 can be disposed on the nitride layer 160. In some embodiments, the conductive layer 215 can be disposed on the dielectric layer 214. The conductive layer 215 can cover a lateral surface of the dielectric layer 214. In some embodiments, the conductive layer 215 can be disposed on the substrate 110. The conductive layer 215 may have an underside coplanar with the top surface of the dielectric layer 214. In some embodiments, the bottom layer of the conductive layer 215 can be lower than the underside of the dielectric layer 212.

In some embodiments, the conductive layers 211, 213, and 215 and dielectric layers 212 and 214 can have the same thickness. In another embodiment, the thickness of the conductive layers 211, 213, and 215 and dielectric layers 212 and 214 can be different. The thickness of the conductive layer 211 can be equal to or greater than that of the dielectric layer 212. The thickness of the dielectric layer 212 can be equal to or greater than that of the conductive layer 213. The thickness of the conductive layer 213 can be equal to or greater than that of the dielectric layer 214. The thickness of the dielectric layer 214 can be equal to or greater than that of the conductive layer 215.

In some embodiments, the conductive layers 211, 213, and 215 can be of the same material. For example, the material of the conductive layers 211, 213, and 215 can include titanium nitride (TiN). In some embodiments, the dielectric layers 212 and 214 can be of the same material. The dielectric layers 212 and 214 may be made of a high-k dielectric material. For example, the dielectric layers 212 and 214 can include zirconium oxide (ZrO2), titanium oxide (TiO2), or the combination thereof.

Referring to FIG. 1A, the contact 220 of the trench capacitor 200a can be disposed on the multilayered stack 210. In some embodiments, the contact 220 can be disposed within the trench defined by the multilayered stack 210. The contact 220 can cover a lateral surface of the multilayered stack 210. For example, the contact 220 can cover a lateral surface of the conductive layer 215. In some embodiments, the contact 220 can be of semiconductor material. For example, the contact 220 can be of polysilicon. In some embodiments, the contact 220 of the trench capacitor 200a can be configured to receive electrical voltage.

Figure 1B:
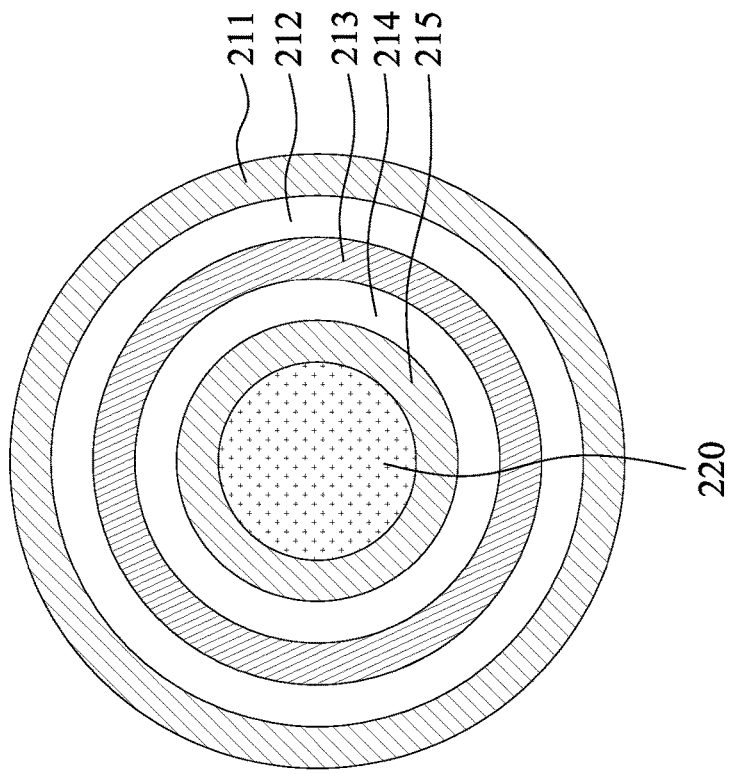
FIG. 1B is a top view of a semiconductor structure along the section line A-A of FIG. 1A, in accordance with some embodiments of the present disclosure.

FIG. 1B is a top view of a semiconductor structure 11 along the section line A-A of FIG. 1A, in accordance with some embodiments of the present disclosure.

FIG. 1B merely shows the semiconductor structure 11 with the trench capacitor (other elements are omitted for clarity). The semiconductor structure 11 can include conductive layers 211, 213, and 215, dielectric layers 212 and 214, and contact 220.

The contact 220 is circular. In some embodiments, the conductive layer 215 surrounds the contact 220. The conductive layer 215 may be concentric with the contact 220. In some embodiments, the dielectric layer 214 surrounds the conductive layer 215. The dielectric layer 214 may be concentric with the conductive layer 215. In some embodiments, the conductive layer 213 surrounds the dielectric layer 214. The conductive layer 213 may be concentric with the dielectric layer 214. In some embodiments, the dielectric layer 212 surrounds the conductive layer 213. The dielectric layer 212 may be concentric with the conductive layer 213. In some embodiments, the conductive layer 211 surrounds the dielectric layer 212. The conductive layer 211 may be concentric with the dielectric layer 212.

FIG. 2A, FIG. 2B, FIG. 2C, FIG. 2D, FIG. 2E, FIG. 2F, FIG. 2G, FIG. 2H and FIG. 2I illustrate various stages of a method for manufacturing a semiconductor structure 10, in accordance with some embodiments of the present disclosure. To facilitate understanding, similar elements shown in FIG. 2A to FIG. 2I are designated with the same the numerals as designated in FIG. 1 and FIG. 1A.

Figure 2A:
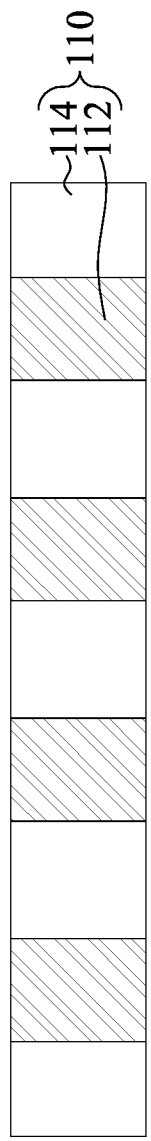
FIG. 2A, FIG. 2B, FIG. 2C, FIG. 2D, FIG. 2E, FIG. 2F, FIG. 2G, FIG. 2H and FIG. 2I illustrate various stages of a semiconductor manufacturing method, in accordance with some embodiments of the present disclosure.

In FIG. 2A, the substrate 110 is provided with the conductive regions 112 and the isolation layer 114. The conductive regions 112 are formed in the isolation layer 114. In some embodiments, the isolation layer 114 can be a shallow trench isolation (STI) structure. In one embodiment, the conductive region 112 can penetrate the isolation layer 114. The conductive region 112 can be of tungsten.

Figure 2B:
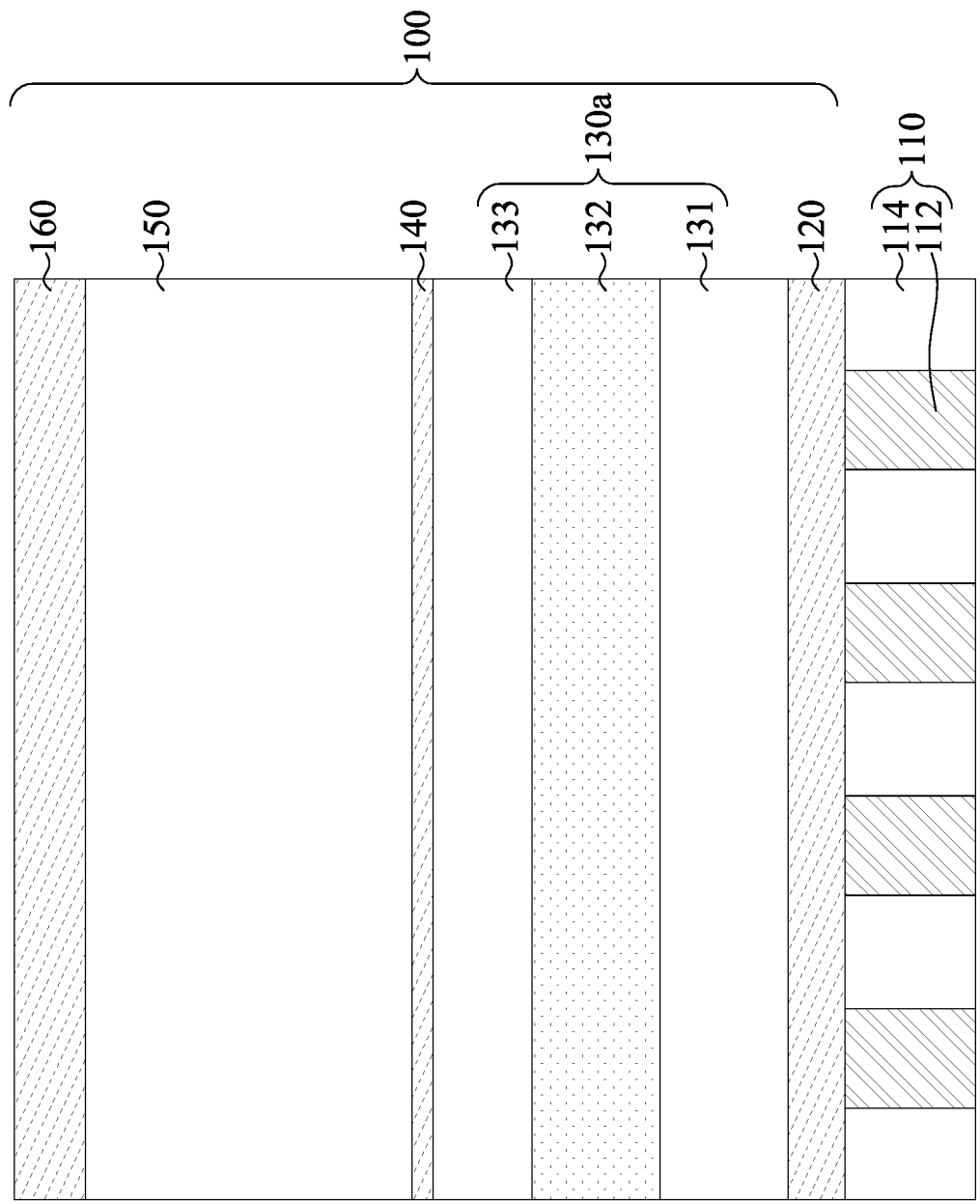

In FIG. 2B, the multilayered stack 100 can be formed on the substrate 110. In some embodiments, the nitride layer 120 of the multilayered stack 100 can be formed on the substrate 110. The silicon-containing layer 130*a* can be formed on the nitride layer 120. In one embodiment, the silicon-containing layer 130*a* can include regions 131, 132, and 133. The region 131 of the silicon-containing layer 130*a* can be formed on the nitride layer 120. The region 132 of the silicon-containing layer 130*a* can be formed on the region 131. The region 133 of the silicon-containing layer 130*a* can be formed on the region 132.

In some embodiments, the regions 131, 132, and 133 can have different doping concentrations. The doping concentration of the region 131 can be different from the doping concentration of the region 132. For example, the doping concentration of the region 131 can be less than the doping concentration of the region 132. In some embodiments, the doping concentration of the region 132 can be different from the doping concentration of the region 133. For example, the doping concentration of the region 132 can be less than the doping concentration of the region 133. Accordingly, the doping concentration of the region 133 may be greater than that of the region 131. In some embodiments, the region 133 can have a boron (B) concentration greater than that of regions 131 and 132. In some embodiments, the region 133 can have a phosphorus (P) concentration exceeding that of regions 131 and 132. In some embodiments, the region 133 can have a B/P concentration exceeding that of regions 131 and 132.

In some embodiments, the nitride layer 140 can be formed on the silicon-containing layer 130*a*. That is, the nitride layer 140 can contact the region 133 of the silicon-containing layer 130*a*. The silicon-containing layer 150 can be formed on the nitride layer 140. The nitride layer 160 can be formed on the silicon-containing layer 150. In some embodiments, the multilayered stack 100 is subsequently performed planarization, such as CMP (chemical-mechanical polishing).

Figure 2C:
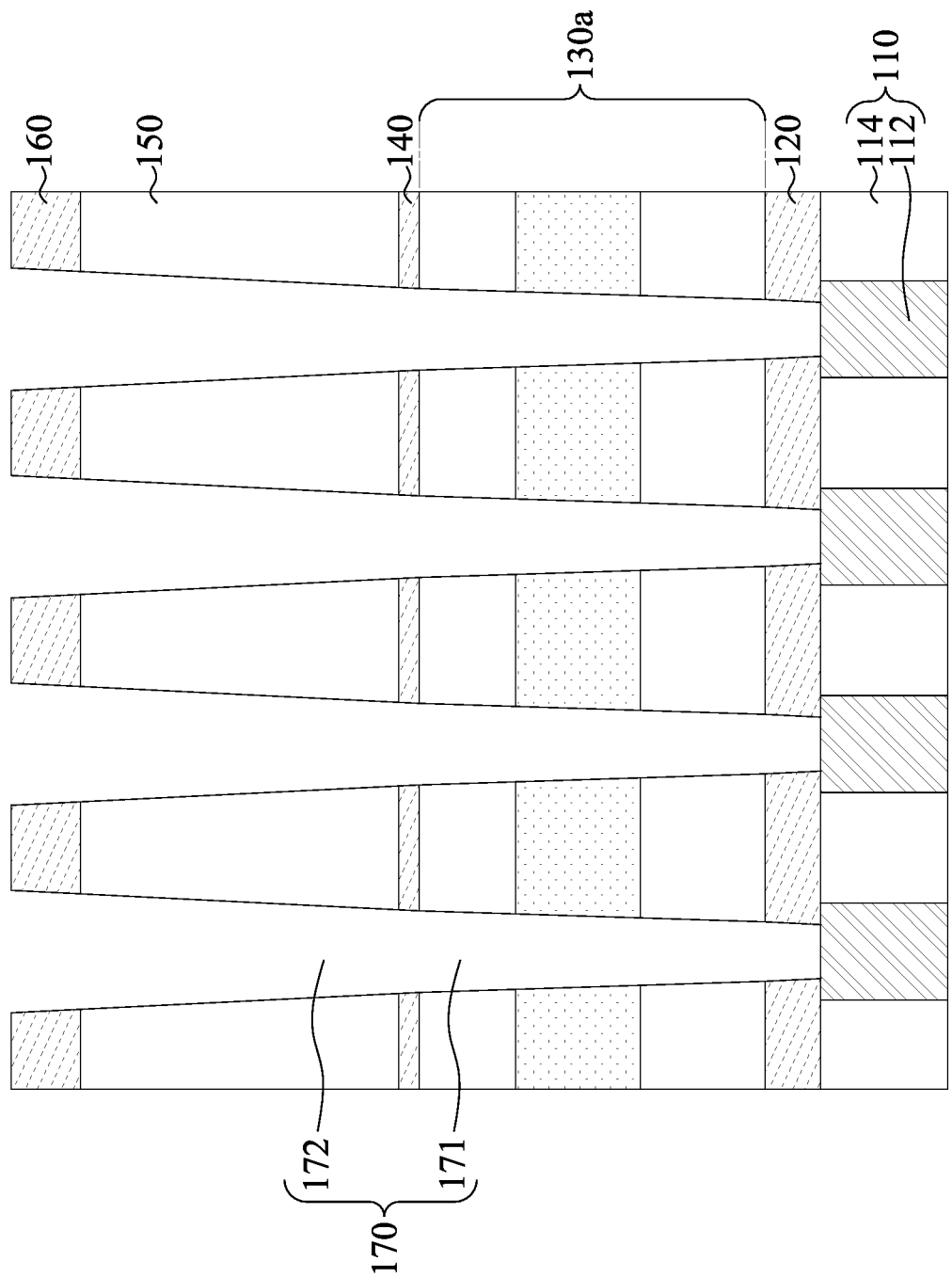

In FIG. 2C, the multilayered stack 100 can undergo a removal operation to form one or more trench 170. In some embodiments, the multilayered stack 100 may be etched to form the trench 170. For example, a dry etchant, such as hydrogen (H2) and nitrogen (N2), may be selected for the dry etching process. In some embodiments, the trench 170 can penetrate the multilayered stack 100. That is, the trench 170 can penetrate the nitride layer 160, the silicon-containing layer 150, the nitride layer 140, the silicon-containing layer 130*a*, and the nitride layer 120. In some embodiments, the trench 170 has a width decreasing toward the substrate 110. In other words, the trench 170 tapers in a direction from the nitride layer 160 toward the nitride layer 120.

The trench 170 can expose the conductive region 112 of the substrate 110. The conductive region 112 can be partially exposed by the multilayered stack 100. In some embodiments, the multilayered stack 100 can be a deep trench structure with the trenches 170. For example, the ratio of a height of the trench 170 to the width of the trench 170 can be greater than 25.

The trench 170 can include portions 171 and 172. The portion 171 of the trench 170 can be surrounded by the silicon-containing layer 130*a*. The portion 172 of the trench 170 can be surrounded by the silicon-containing layer 150. The portion 172 of the trench 170 can have a width exceeding that of the portion 171. In some embodiments, the width of the portion 171 may be too small to form a trench capacitor with good quality.

Figure 2D:
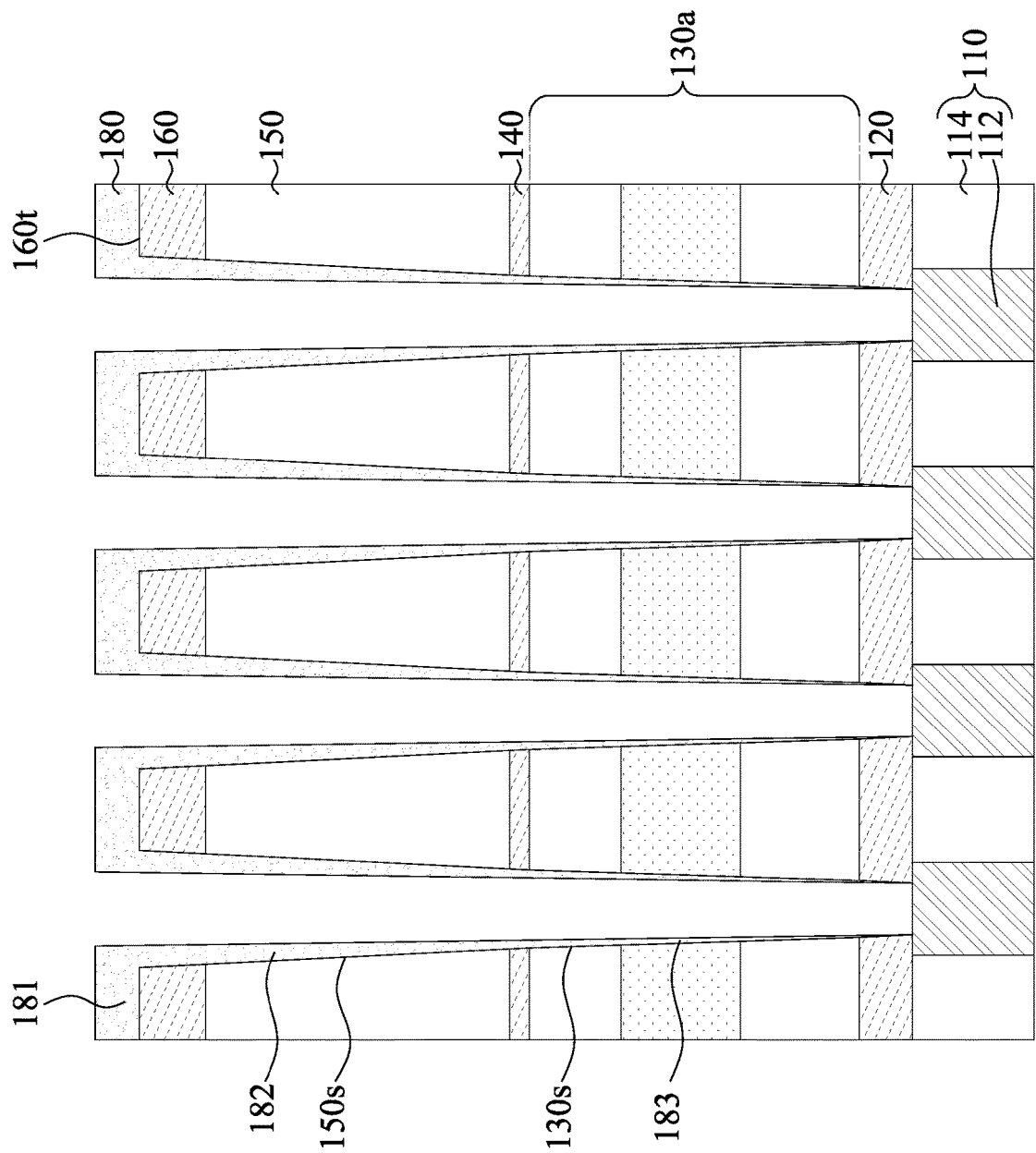

In FIG. 2D, a protective layer 180 can be disposed on a top surface 160*t* of the nitride layer 160. In one embodiment, the protective layer 180 can be disposed within the trench 170. The protective layer 180 can be deposited along the contour of the trench 170. For example, the protective layer 180 may be deposited by CVD (chemical vapor deposition). In some embodiments, the protective layer 180 can be disposed on a lateral surface of the trench 170. In some embodiments, the protective layer 180 can be disposed on a lateral surface of the multilayered stack 100. For example, the protective layer 180 can cover a lateral surface 150*s* of the silicon-containing layer 150. The protective layer 180 can cover a lateral surface 130*s* of the silicon-containing layer 130*a*.

In one embodiment, the top surface of the substrate 110 can be free from the protective layer 180. In another embodiment, the protective layer 180 can be disposed on the top surface of the substrate 110. In some embodiments, the protective layer 180 can be partially disposed on the top surface of the substrate 110.

The protective layer 180 can have an uneven thickness along the contour of the trench 170. In some embodiments, the protective layer 180 has portions 181, 182, and 183. The portion 181 is on the nitride layer 160. The portion 182 covers a lateral surface 150*s* of the silicon-containing layer 150. The portion 183 covers a lateral surface 130*s* of the silicon-containing layer 130*a*. In some embodiments, the portion 181 of the protective layer 180 can have a thickness exceeding a thickness of a portion 182. The thickness of the portion 182 of the protective layer 180 can exceed that of the portion 183. For example, the difference between the thickness of portion 181 and the portion 183 can exceed that of the portion 183 by about 1 µm. In some embodiments, the thickness difference between the portion 181 and the portion 183 can equal or exceed 1 µm. In some embodiments, the protective layer 180 can have a thickness decreasing along a direction from the nitride layer 160 toward the substrate 110.

Figure 2E:
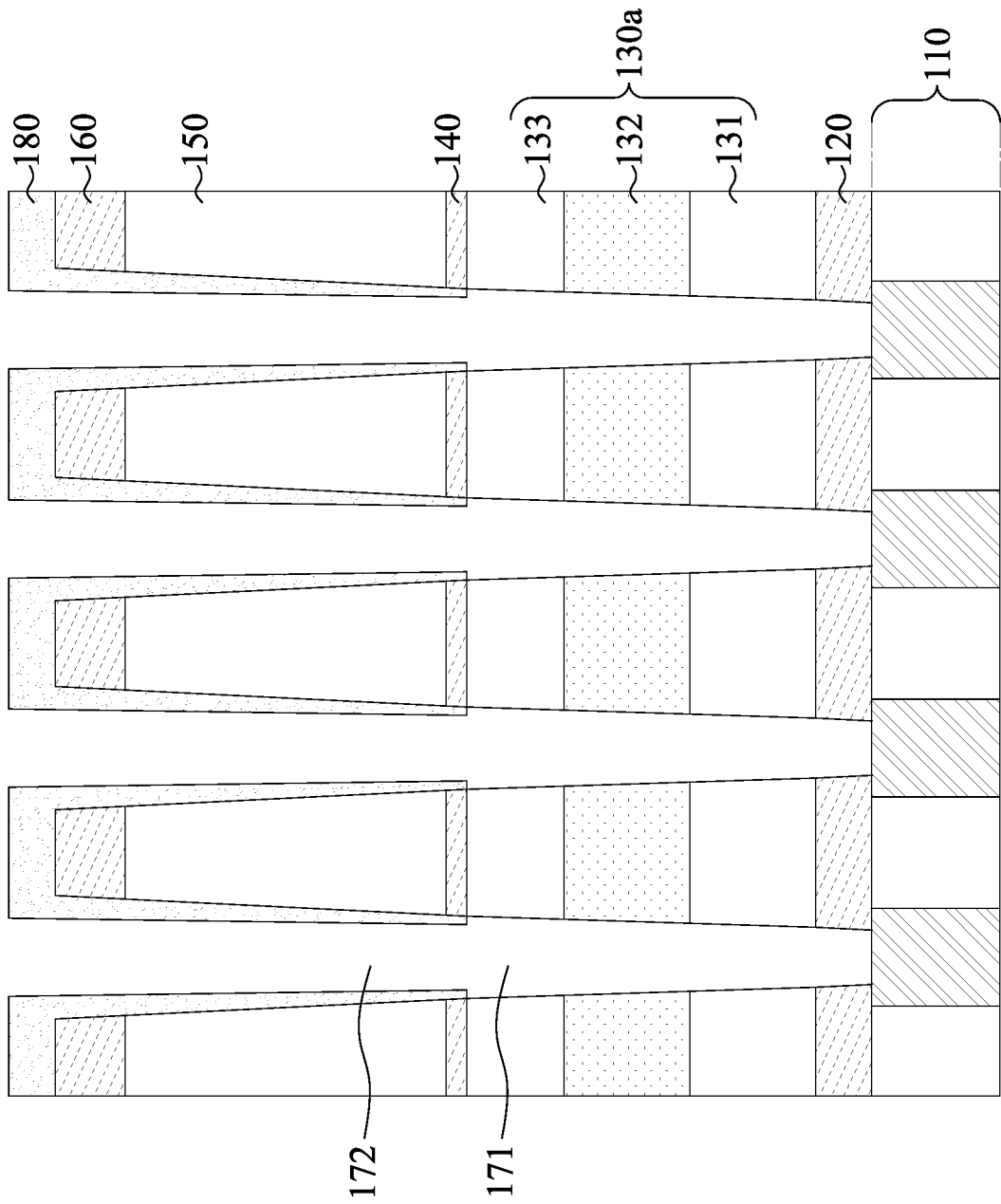

In FIG. 2E, a removal operation can be performed to remove a portion of the protective layer 180. The silicon-containing layer 130a can be exposed by the protective layer 180. The silicon-containing layer 130a can be free from the protective layer 180. In some embodiments, the portion 183 of the protective layer 180 can be removed to expose the silicon-containing layer 130a. The nitride layer 120 may be exposed by the protective layer 180. In some embodiments, the nitride layer 140 may be partially exposed by the protective layer 180. After the removal operation is performed on the portion 183 of the protective layer 180, the portion 171 of the trench 170 can be free from the protective layer 180. In some embodiments, the portion 172 of the trench 170 can be protected by the protective layer 180.

The removal operation performed on the protective layer 180 can be dry etching. The removal operation can be anisotropic etching. In some embodiments, the portion 183 of the protective layer 180 can be removed by a remote capacitively coupled plasma (CCP) source. For example, the protective layer 180 can be removed by hydrogen (H2) or helium (He) plasma treatment.

In some embodiments, the removal operation (dry etching) performed on the protective layer 180 can have a high selectivity to titanium nitride, exceeding that to silicon oxide. For example, a ratio of the selectivity to titanium nitride to the selectivity to silicon oxide can exceed 200. In another embodiment, the dry etching process can have a selectivity to titanium nitride exceeding that to tungsten. For example, a ratio of the selectivity to titanium nitride to the selectivity to tungsten can exceed 100. While dry etching can easily remove titanium nitride, removal of silicon oxide and tungsten can be more difficult. Accordingly, dry etching can be suitable for removing the protective layer 180 of titanium nitride.

Figure 2F:
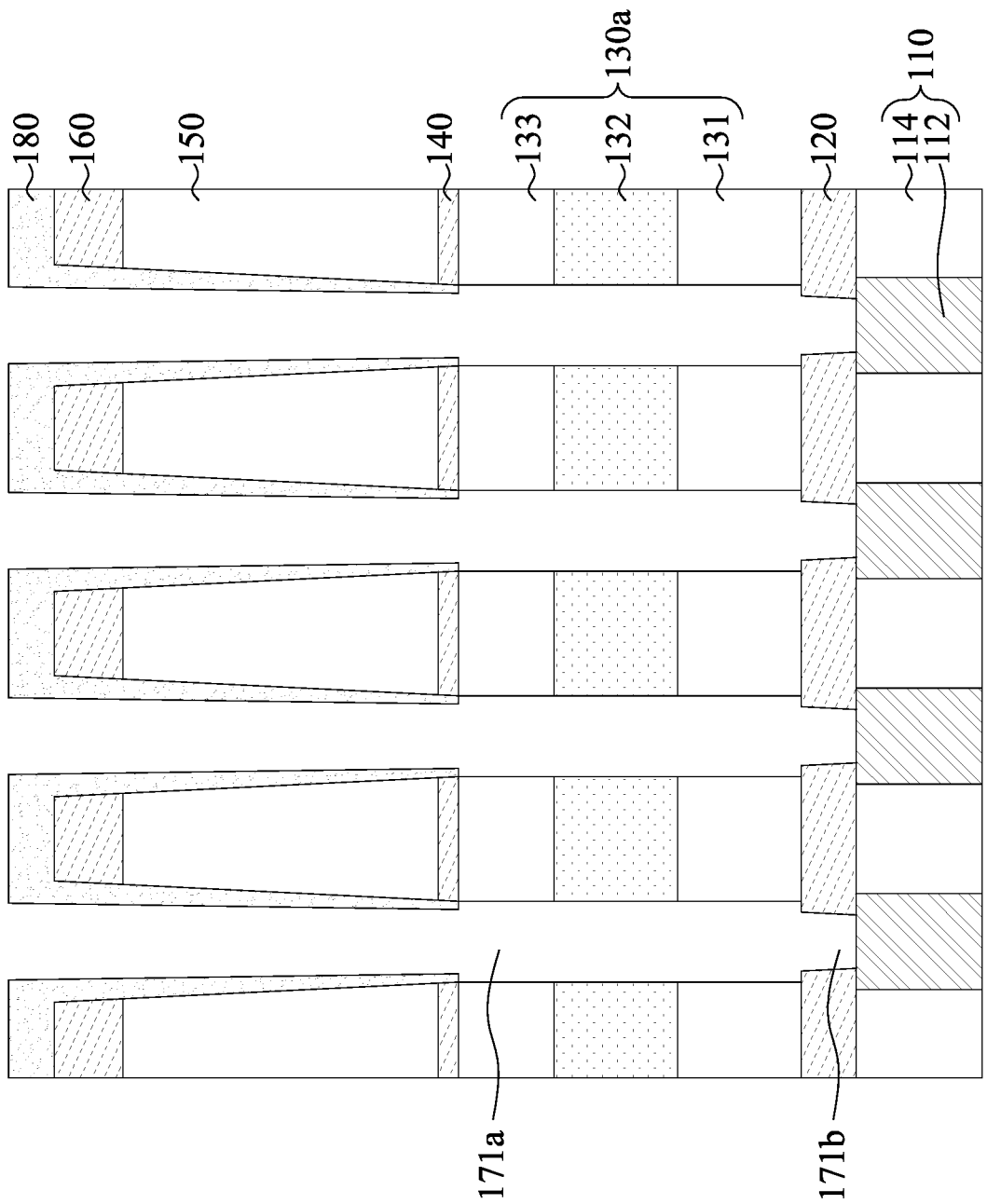

In FIG. 2F, a removal operation can be performed on the silicon-containing layer 130a to expand the portion 171 of the trench 170. In some embodiments, the portion 171 can have a region 171a surrounded by the silicon-containing layer 130a and a region 171b surrounded by the nitride layer 120. The region 171a can be expanded by removing the silicon-containing layer 130a. The region 171a may have a uniform width. In some embodiments, the region 171a can have a lateral surface substantially perpendicular to the substrate 110. That is, the lateral surface of the region 171a extends vertically. The region 171b remains the same shape as in FIG. 2E since the nitride layer 120 and the conductive region 112 of the substrate 110 are barely removed in this process due to etching selectivity.

The removal operation performed on the silicon-containing layer 130a can be a wet etching. In some embodiments, hydrogen fluoride (HF) can be used as etchant to etch the silicon-containing layer 130a.

In some embodiments, the removal operation (wet etching) performed on the silicon-containing layer 130a can have a high selectivity to silicon oxide. In some embodiments, the etchant of the wet etching can have different selectivity to different materials. The etchant of the wet etching can have a selectivity to silicon oxide exceeding that to silicon nitride. The wet etching can easily remove silicon oxide but is hard to remove the silicon nitride. Accordingly, this wet etching can be suitable for removing the silicon-containing layer 130a made of silicon oxide. In some embodiments, this wet etching can have a selectivity to BPSG relatively higher than that to thermal silicon oxide, tetraethoxysilane (TEOS) doped with P, plasma-enhanced tetraethylorthosilicate (PETEOS), or silicon oxide doped with other dopants. For example, the wet etching can have selectivity to BPSG exceeding that to silicon nitride, such that the opening of the silicon-containing layer 130a, which may be made of BPSG, can be easily widened.

In some embodiments, the etching rate can be different when the silicon oxide has different doping concentrations. For example, the regions 131, 132, and 133 of the silicon-containing layer 130a having different doping concentrations can have different etching rates. In some embodiments, the etching rate can decrease as the B/P doping concentration increases. Since the doping concentration of the region 133 is greater than that of the region 132, the etching rate of the region 132 can exceed that of the region 133. As the doping concentration of the region 132 exceeds that of the region 131, the etching rate of the region 131 can exceed that of the region 132. Therefore, the conical portion 171 of the trench 170 can become cylindrical through the wet etching performed on the silicon-containing layer 130a.

Figure 2G:
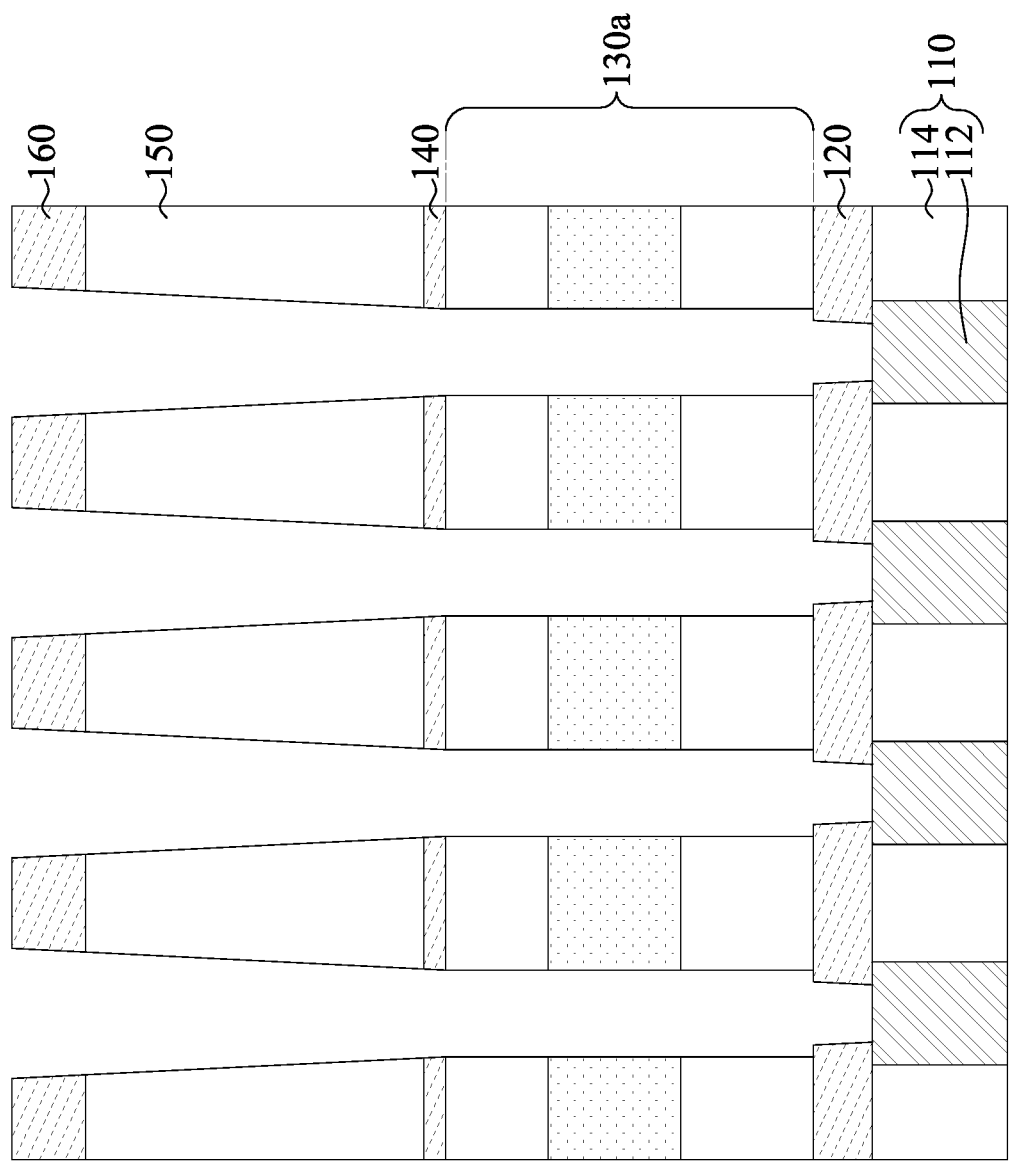

In FIG. 2G, the protective layer 180 can be removed. In some embodiments, the protective layer 180 can be removed to expose the nitride layer 140, the silicon-containing layer 150, and the nitride layer 160. In some embodiments, the protective layer 180 can be removed in a manner similar to that described in FIG. 2E. As the dry etching process can have a selectivity to titanium nitride relatively higher than that to silicon oxide and silicon nitride, the protective layer 180 can be removed without affecting the nitride layers 120, 140, and 160, the silicon-containing layer 150, and the conductive region 112 of the substrate 110.

Figure 2H:
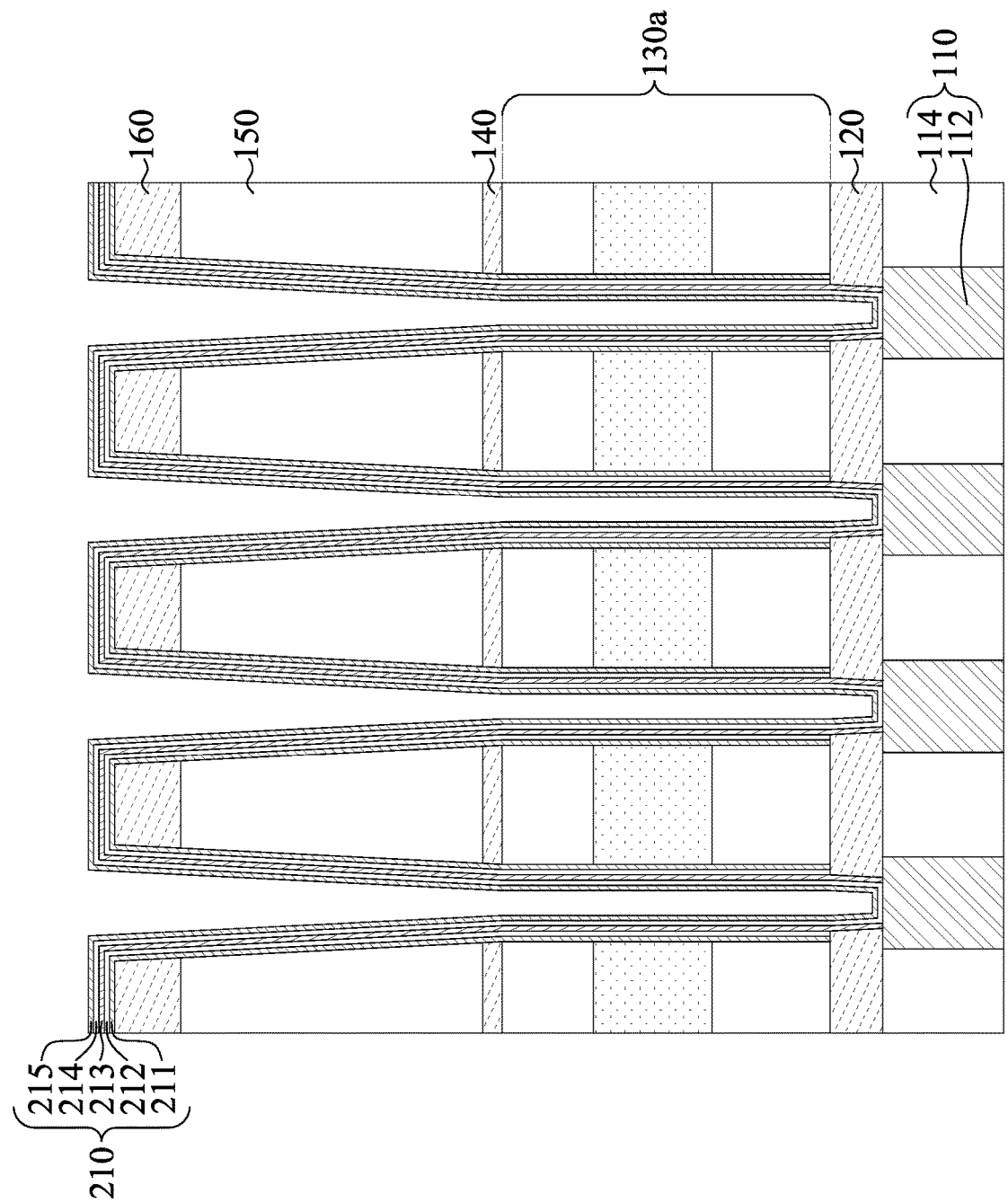

In FIG. 2H, a multilayered stack 210 of the trench capacitor 200a can be formed within the trench 170. In some embodiments, the multilayered stack 210 can be disposed on the nitride layer 160. In some embodiments, the multilayered stack 210 can be disposed along the contour of the trench 170. For example, the multilayered stack 210 can cover a lateral surface of the nitride layers 120, 140, and 160, the silicon-containing layers 130a and 150. The multilayered stack 210 can be disposed on the substrate 110. The multilayered stack 210 can cover the top surface of the conductive region 112 penetrating the isolation layer 114 of the substrate 110. In one embodiment, the multilayered stack 210 can define an opening. In some embodiments, the multilayered stack 210 can define a trench having the contour corresponding to the trench 170.

The conductive layer 211 can be disposed along the contour of the trench 170. In some embodiments, the conductive layer 211 of the multilayered stack 210 can be disposed on the nitride layer 160. In some embodiments, the conductive layer 211 can be disposed adjacent to the nitride layer 160, the silicon-containing layer 150, the nitride layer 140, and the silicon-containing layer 130a. The conductive layer 211 can cover a lateral surface of the nitride layer 160, the silicon-containing layer 150, the nitride layer 140, and the silicon-containing layer 130a. In some embodiments, the conductive layer 211 can contact the nitride layer 120.

The dielectric layer 212 of the multilayered stack 210 can be disposed along the contour of the trench 170. The dielectric layer 212 of the multilayered stack 210 can be disposed on the conductive layer 211. The dielectric layer 212 can cover a lateral surface of the conductive layer 211. In some embodiments, the dielectric layer 212 can contact the nitride layer 120.

The conductive layer 213 of the multilayered stack 210 can be disposed along the contour of the trench 170. In some embodiments, the conductive layer 213 can be disposed on the dielectric layer 212. The conductive layer 213 can cover a lateral surface of the dielectric layer 212. In some embodiments, the conductive layer 213 can cover a lateral surface of the nitride layer 120. In some embodiments, the conductive layer 213 can contact the substrate 110. In some embodiments, the conductive layer 213 can contact the conductive region 112 exposed from the isolation layer 114.

The dielectric layer 214 of the multilayered stack 210 can be disposed along the contour of the trench 170. In some embodiments, the dielectric layer 214 can be disposed on the conductive layer 213. The dielectric layer 214 can cover a lateral surface of the conductive layer 213. In some embodiments, the dielectric layer 214 can contact the substrate 110. In some embodiments, the dielectric layer 214 can contact the conductive region 112 exposed by the isolation layer 114. In some embodiments, the dielectric layer 214 can be disposed on the substrate 110.

The conductive layer 215 of the multilayered stack 210 can be disposed along the contour of the trench 170. In some embodiments, the conductive layer 215 can be disposed on the dielectric layer 214. The conductive layer 215 can cover a lateral surface of the dielectric layer 214. In some embodiments, the conductive layer 215 can be disposed on the substrate 110.

Figure 2I:
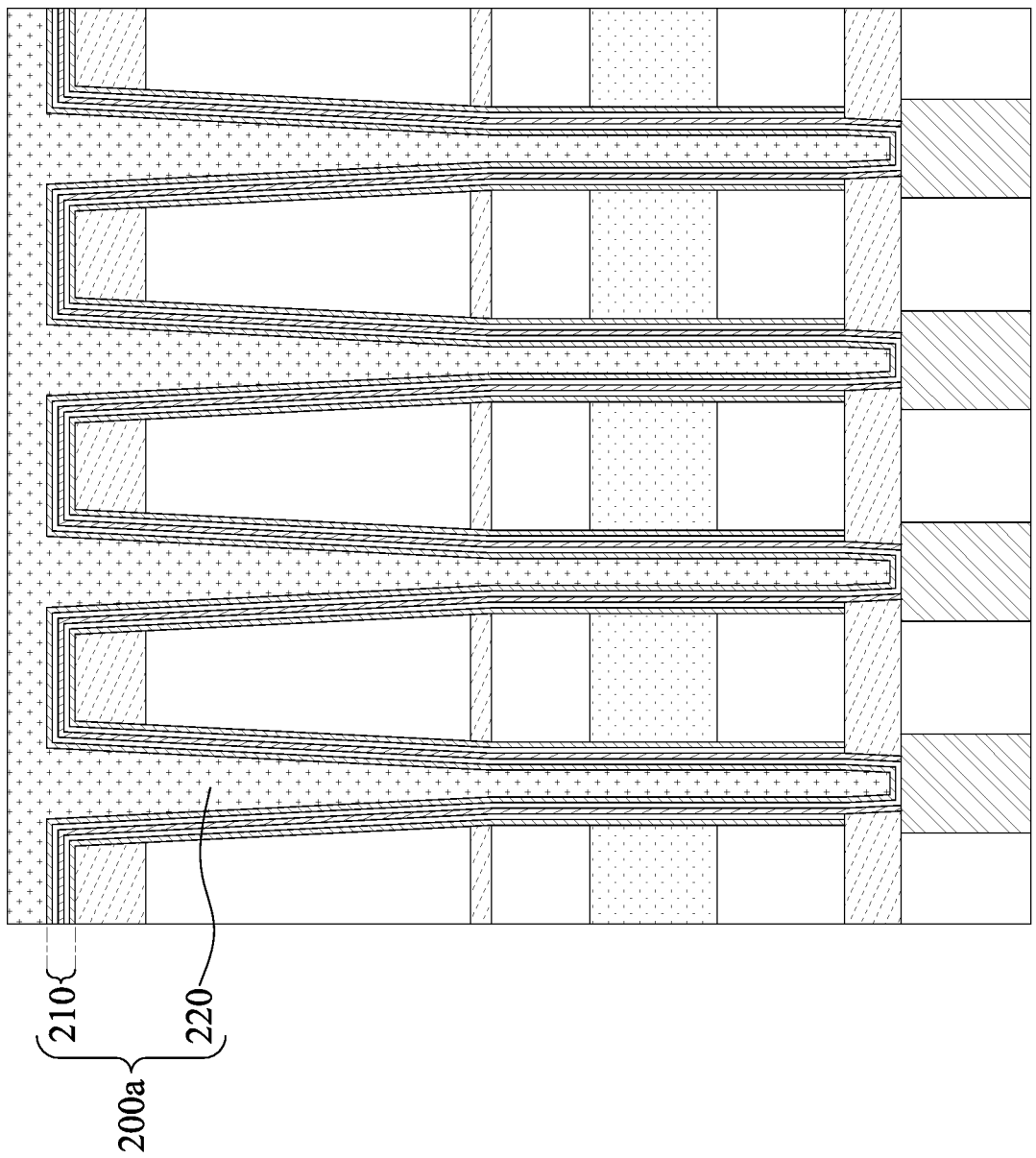

In FIG. 2I, the contact 220 of the trench capacitor 200a is disposed on the multilayered stack 210. In some embodiments, the contact can be formed within the trench defined by the multilayered stack 210.

Figure 3:
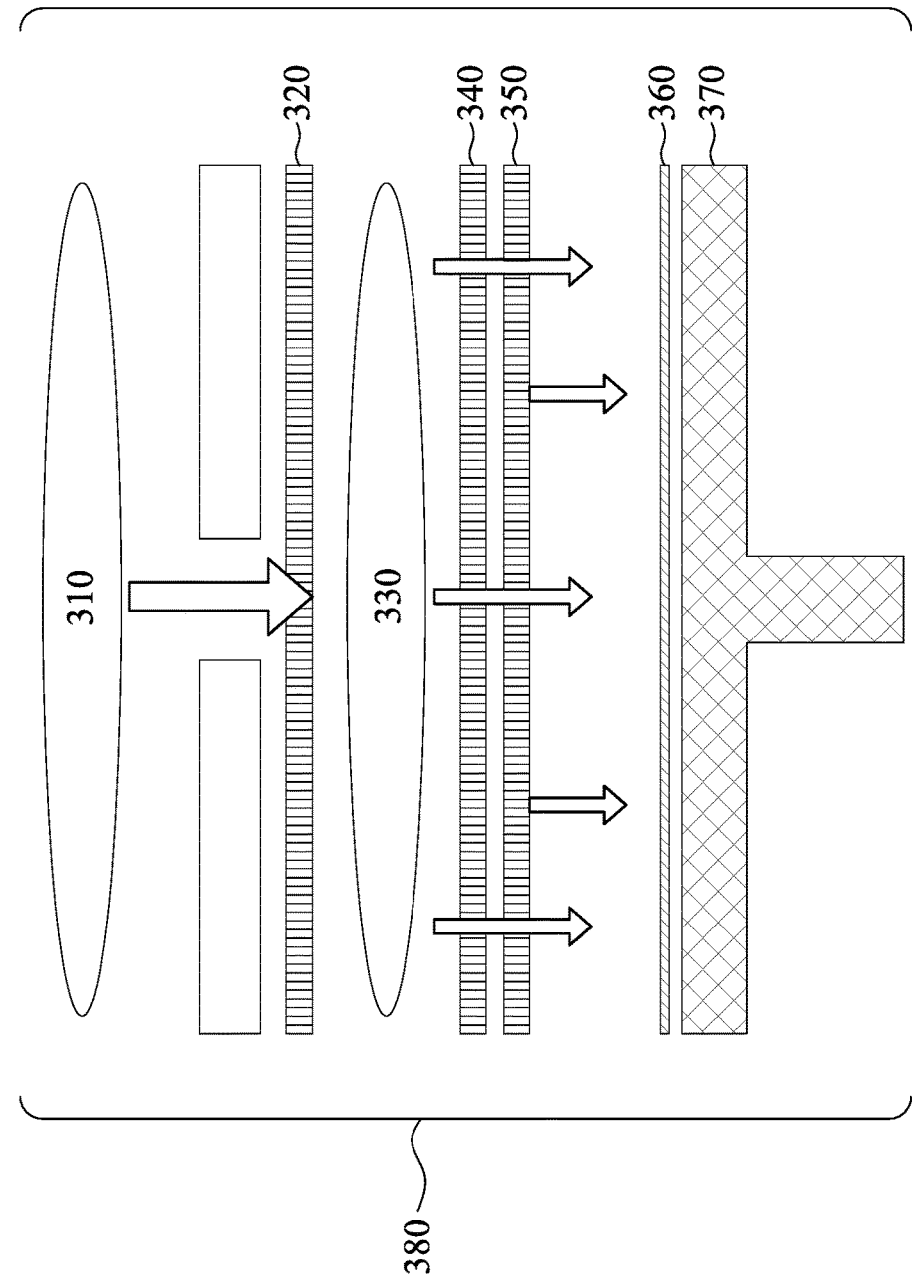
FIG. 3 is a schematic diagram of an etching apparatus, in accordance with some embodiments of the present disclosure.

FIG. 3 is a schematic diagram of an etching apparatus 300, in accordance with some embodiments of the present disclosure. The etching apparatus 300 can be a dry etch chamber. In some embodiments, the etching apparatus 300 can perform dry etching process as described in FIG. 2E and FIG. 2G. The etching apparatus 300 includes an etchant chemistry 310, a face plate 320, a mixture 330, a dispenser 340, a shower head 350, a wafer 360, a pedestal 370, and chamber walls 380.

Referring to FIG. 3, the pedestal 370 can support the wafer 360. In some embodiments, the wafer 360 includes memory devices thereon. The wafer 360 supported by the pedestal 370 can be disposed within the etching chamber 300 surrounded by the chamber walls 380. In some embodiments, the etchant chemistry 310 can be inserted through an opening to the face plate 320. The etchant chemistry 310 can pass through the face plate 320 and have reaction to become ion and radical mixture 330. The ion and radical mixture 330 can pass through the dispenser 340 and the shower head 350 to generate plasma applied on the wafer 360.

During the etching process, the face plate 320 can have a temperature of about 85° C. In some embodiments, the dispenser 340 can have a temperature of about 20° C. In some embodiments, the shower head 350 can have a temperature of about 160° C. In some embodiments, the pedestal 370 can have a temperature of about 385° C.

Figure 4:
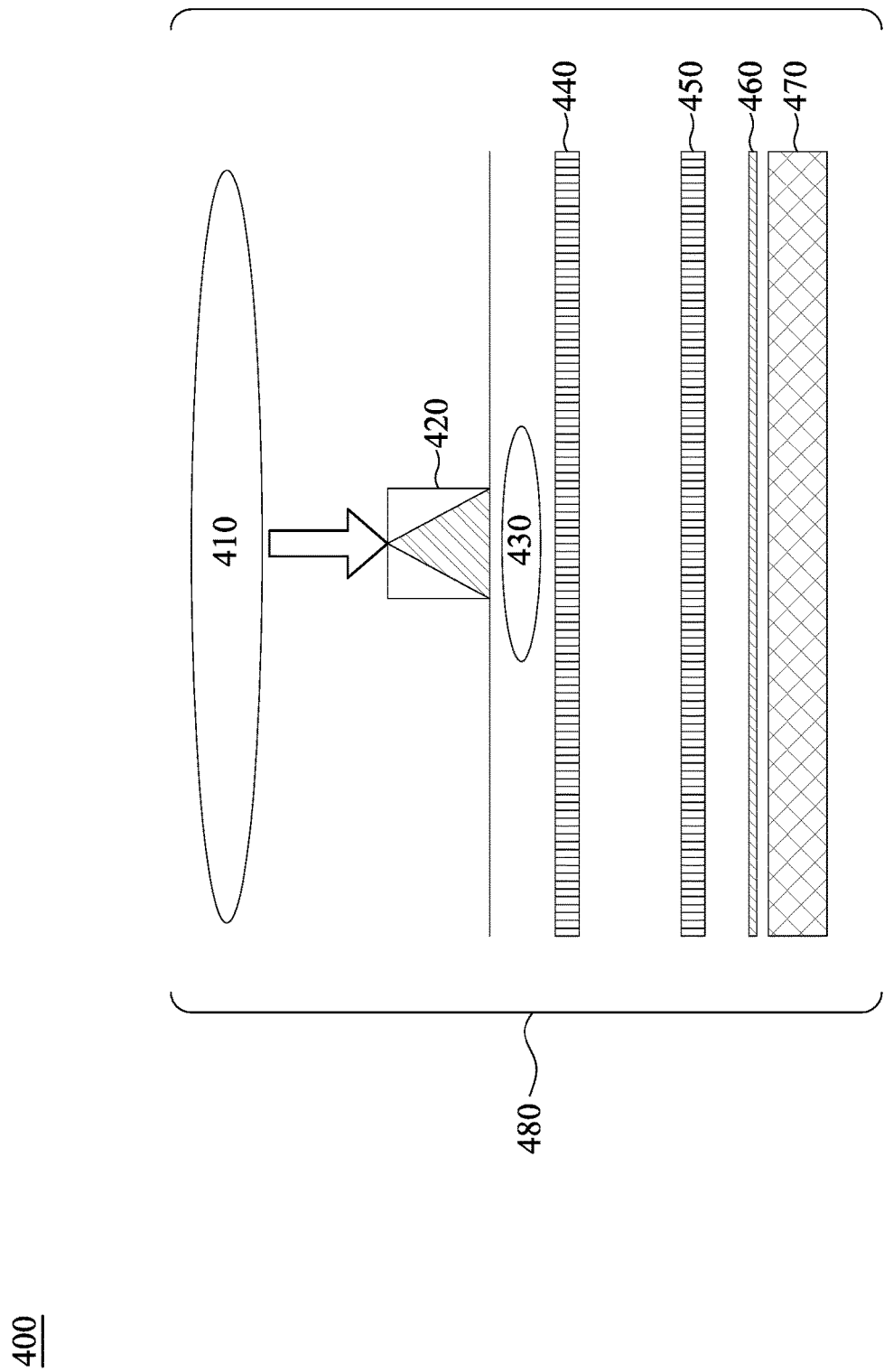
FIG. 4 is a schematic diagram of an etching apparatus, in accordance with some embodiments of the present disclosure.

FIG. 4 is a schematic diagram of an etching apparatus 400, in accordance with some embodiments of the present disclosure. The etching apparatus 400 can be a wet etch chamber. In some embodiments, the etching apparatus 400 can perform wet etching as described in FIG. 2F. The etching apparatus 400 includes an etchant chemistry 410, an injector 420, a mixture 430, a dispenser 440, a shower head 450, a wafer 460, a pedestal 470, and chamber walls 480.

Referring to FIG. 4, the pedestal 470 can support the wafer 460. In some embodiments, the wafer 460 includes memory devices thereon. The wafer 460 supported by the pedestal 470 can be disposed within the etching chamber 400 surrounded by the chamber walls 480. In some embodiments, the etchant chemistry 410 can be inserted through the injector 420. The mixture 430 of the etch chemistry 410 can pass through the dispenser 440 and the shower head 450 to be applied on the wafer 460. In some embodiments, the mixture 430 can be $H_2O$ and HF.

During the etching process, the shower head 450 can have a temperature of about 180° C. In some embodiments, the pedestal 470 can have a temperature of about −20° C. In some embodiments, the chamber walls 480 can have a temperature of about 85° C. In some embodiments, the wafer 460 can have a low temperature at the center due to the temperature of the pedestal 470. In some embodiments, the wafer 460 can have a high temperature at the edge affected by the chamber wall 480.

Figure 5:
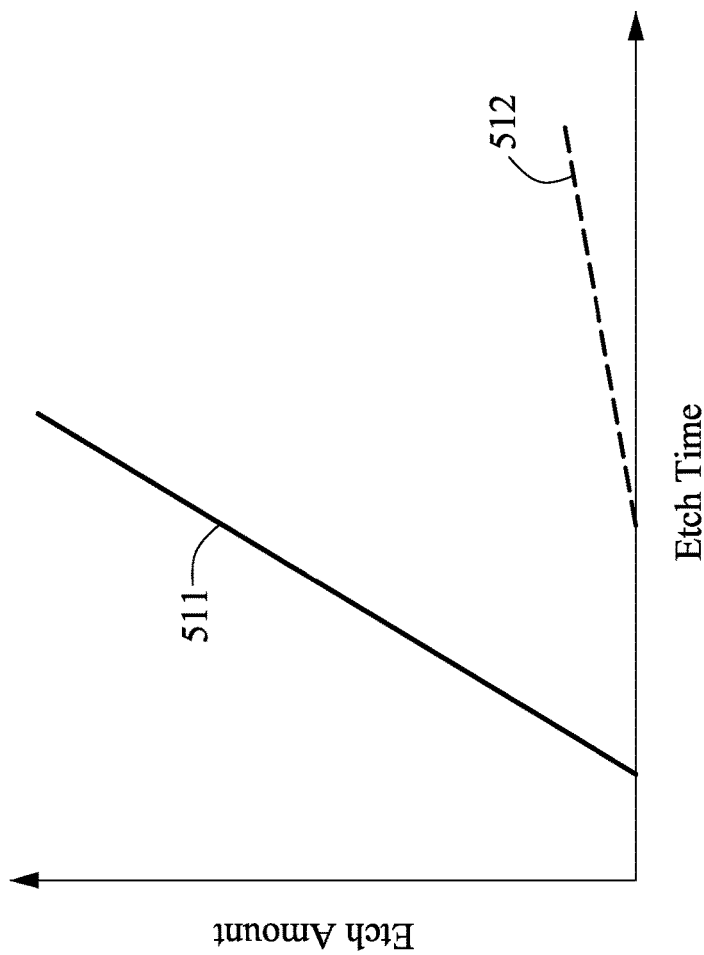
FIG. 5 is a graph illustrating etch time versus etch amount of semiconductor material, in accordance with some embodiments of the present disclosure.

FIG. 5 is a graph 500 illustrating etch time versus etch amount of semiconductor material, in accordance with some embodiments of the present disclosure. The graph 500 shows characteristics of the wet etching. In some embodiments, the wet etching can be that described with respect to FIG. 2F.

Referring to FIG. 5, the x-axis represents etch time. The y-axis represents etch amount. The line 511 shows the etch characteristics of low quality oxide material. The line 512 shows the etch characteristics of high quality oxide material. The line 511 has a slope having an absolute value exceeding that of the slope of the line 512. That is, the low quality oxide material can be etched faster than the high quality oxide material. The point of intersection of the line 511 and the x-axis has a value less than a value of the point of the intersection of the line 512 and the x-axis. It implies that the low quality oxide material can be etched easier and faster than the high quality oxide material.

In some embodiments, the low quality oxide material can include silicon oxide doped with high density of dopants. For example, the low quality oxide material can include high-density plasma silicon oxide (HDP). On the contrary, the high quality oxide material can include silicon oxide doped with low density of dopants. For example, the high quality oxide material can include thermal oxide. In some embodiments, the low quality oxide material can have a hydrophilicity exceeding that of the high quality oxide material. As the low quality oxide material has a relatively high hydrophilicity, it can be easier to etch.

Figure 6:
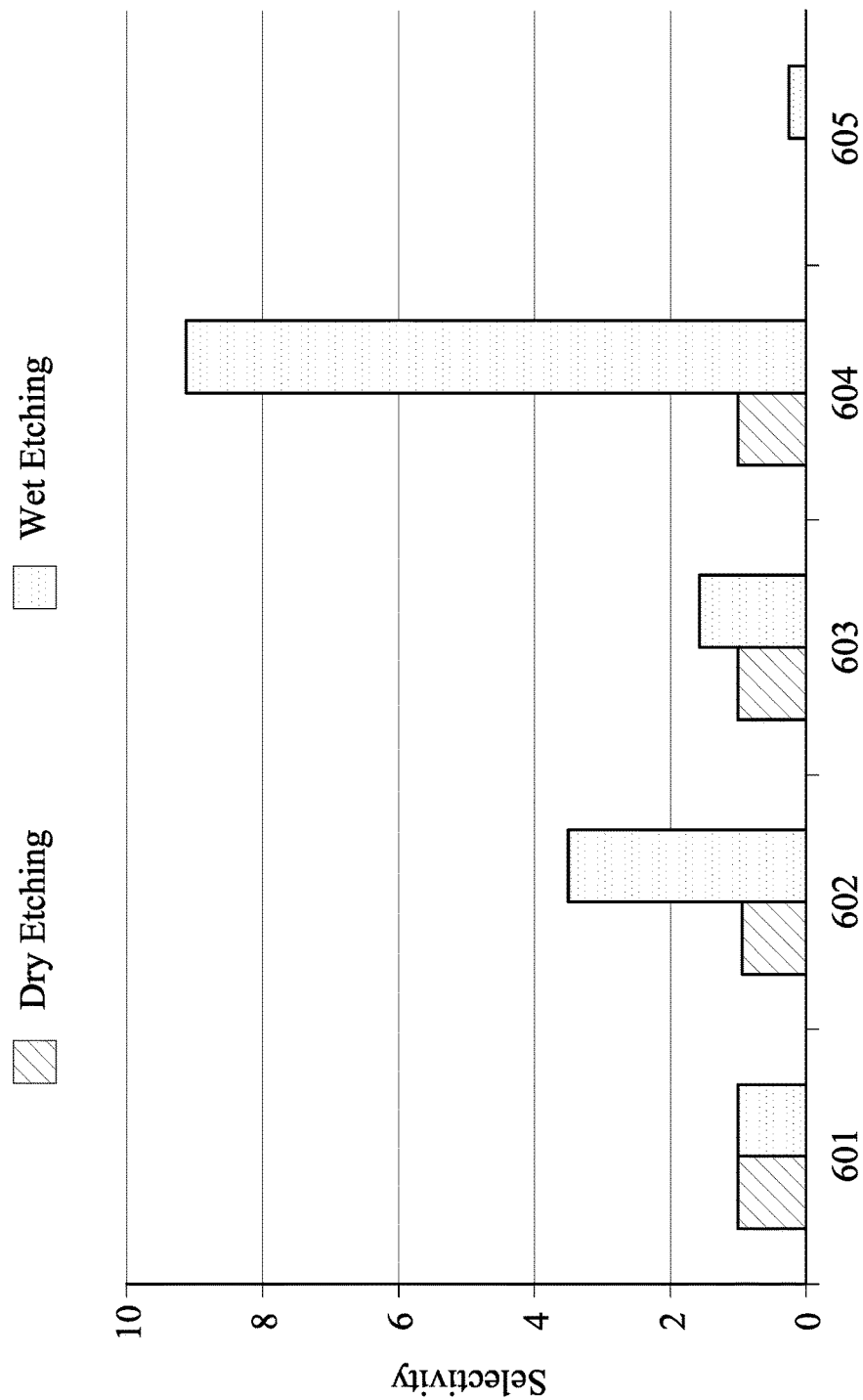
FIG. 6 is a graph illustrating the selectivity of semiconductor manufacturing process to different semiconductor materials, in accordance with some embodiments of the present disclosure.

FIG. 6 is a graph 600 illustrating the selectivity of semiconductor manufacturing process to different semiconductor materials, in accordance with some embodiments of the present disclosure. The graph 600 shows selectivity of different material with respect to dry etching and wet etching. In some embodiments, the dry etching process can be that described with respect to FIG. 2E and FIG. 2G. In some embodiments, the wet etching can be that described with respect to FIG. 2F.

The x-axis provides five materials 601, 602, 603, 604, and 605. The y-axis represents selectivity. The graph 600 shows the selectivity to each of materials 601, 602, 603, 604, and 605 with dry etching and wet etching. The material 601 can be thermal oxide. The material 602 can be PETEOS. The material 603 can be HDP. The material 604 can be BPSG. The material 605 can be SiN.

Referring to FIG. 6, the dry etching has a similar selectivity to the materials 601, 602, 603, and 604. Nevertheless, the dry etching is hard to etch the material 605. The wet etching can have a selectivity to the materials 602, 603, and 604 exceeding that of dry etching. The wet etching can have a selectivity to the material 601 substantially identical to that of dry etching.

The material 601 can have a selectivity of about 1 for wet etching. The material 602 can have a selectivity of about 3.5 for wet etching. The material 603 can have a selectivity of about 1.5 for wet etching. The material 604 can have a selectivity of about 9 for wet etching. The material 605 can have a selectivity of about 0.3 for wet etching. In some embodiments, the wet etching can have the highest selectivity to the material 604 among the materials 601, 602, 603, 604, and 605. The material 605 can have the lowest selectivity to the material 605 among the materials 601, 602, 603, 604, and 605 for wet etching. Accordingly, the wet etching is effective to remove BPSG.

Figure 7:
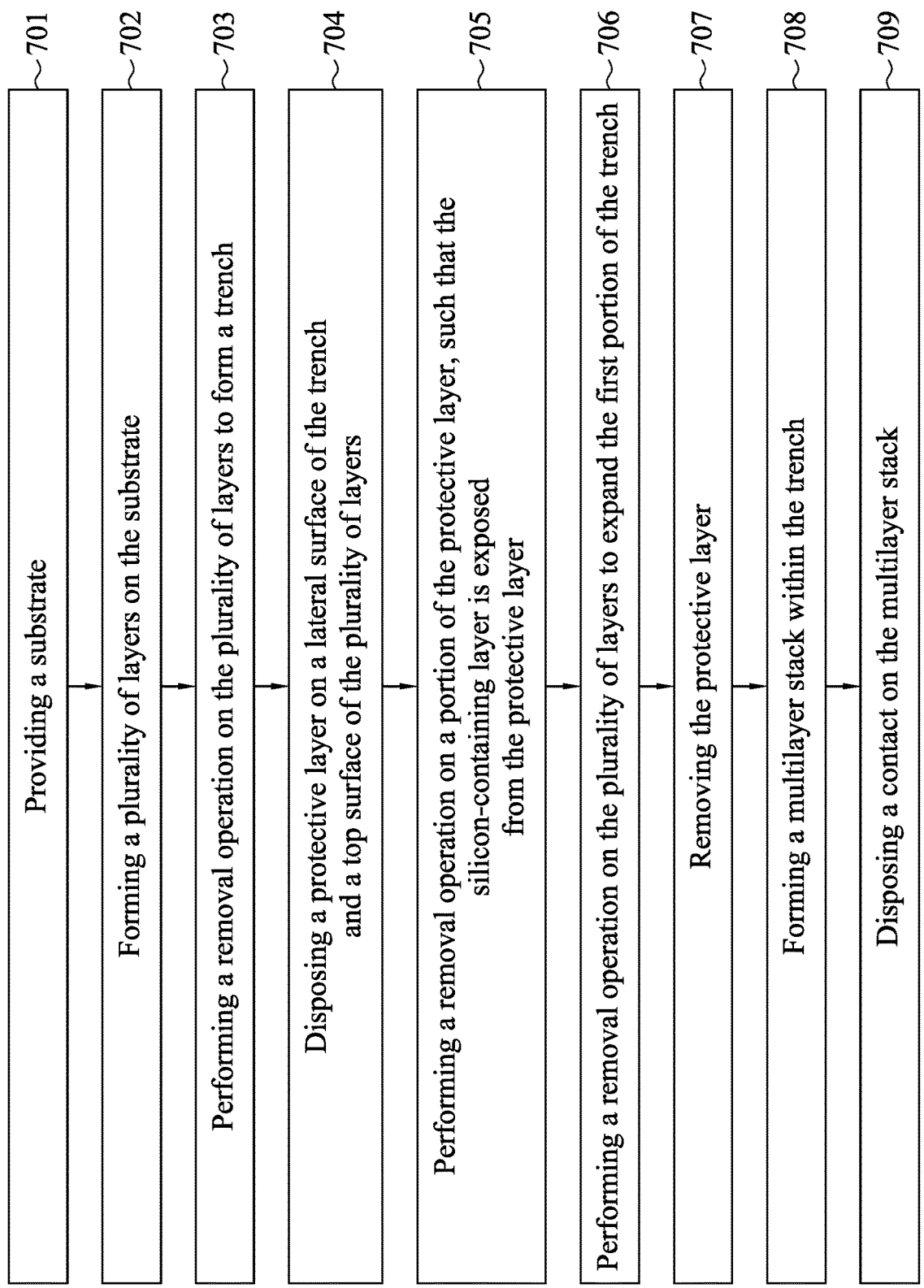
FIG. 7 is a flowchart of a method for manufacturing a semiconductor structure, in accordance with some embodiments of the present disclosure.

FIG. 7 is a flowchart of a method 700 for manufacturing a semiconductor structure 10, in accordance with some embodiments of the present disclosure. In some embodiments, this method can be conducted to manufacture the semiconductor devices 10 and 10a in FIG. 1 and FIG. 1A. The method 700 for forming a semiconductor structure 10 may include operations 701, 702, 703, 704, 705, 706, 707, 708, and 709. To better understanding, the method 700 is described with the numerals designated in the semiconductor structure 10/10a as shown in FIG. 1, FIG. 1A, and FIG. 2A to FIG. 2I.

In operation 701, the substrate 110 is provided. In some embodiments, the operation 701 can correspond to FIG. 2A. The substrate 110 can include an isolation layer 114 and a conductive region 112. The details of the operation 701 are described in the paragraphs related to FIG. 2A.

In operation 702, a plurality of layers 100 are formed on the substrate 110. In some embodiments, the plurality of layers 100 can be a multilayered stack 100 as shown in FIG. 2B. The plurality of layers 100 can include nitride layers 120, 140, and 160, and silicon-containing layers 130/130a and 150. The nitride layer can be formed on the substrate 110. The silicon-containing layer 130/130a can be formed on the nitride layer 120. The nitride layer (or intermediate layer) 140 can be formed on the silicon-containing layer 130/130a. The silicon-containing layer 150 can be formed on the intermediate layer 140. The nitride layer 160 can be formed on the silicon-containing layer 150.

In some embodiments, the operation 702 can correspond to FIG. 2B. The details of the operation 702 are described in the paragraphs related to FIG. 2B.

In operation 703, a removal operation is performed on the plurality of layers 100 to form a trench 170. The trench 170 can penetrate the nitride layer 160, the silicon-containing layer 150, the intermediate layer 140, the silicon-containing layer 130/130a, and the nitride layer 120. In some embodiments, the trench 170 includes a first portion 171 surrounded by the silicon-containing layer 130/130a and a second portion 172 surrounded by the silicon-containing layer 150. In some embodiments, the operation 703 can correspond to FIG. 2C. The details of the operation 703 are described in the paragraphs related to FIG. 2C.

In operation 704, a protective layer 180 can be disposed on a lateral surface of the trench 170 and a top surface of the plurality of layers 100. In some embodiments, the protective layer 180 can be disposed on the top surface of the nitride layer 160. In some embodiments, the operation 704 can correspond to FIG. 2D. The details of the operation 704 are described in the paragraphs related to FIG. 2D.

In operation 705, a removal operation is performed on a portion of the protective layer 180, such that the silicon-containing layer 130/130a is exposed from the protective layer 180. The protective layer 180 can be partially removed to expose the silicon-containing layer 130/130a, nitride layer 120 and the conductive region 112 of the substrate 110.

In some embodiments, the first portion 171 of the trench 170 can be free from the protective layer 180. The protective layer 180 can cover the nitride layer 140, silicon-containing layer 150, and nitride layer 160. That is, the protective layer 180 can still remain a portion to protect the nitride layer 140, silicon-containing layer 150, and nitride layer 160. In some embodiments, the removal operation 705 can be a dry etching process. In some embodiments, the operation 705 can correspond to FIG. 2E. The details of the operation 705 are described in the paragraphs related to FIG. 2E.

In operation 706, a removal operation can be performed on the plurality of layers 100 to expand the first portion 171 of the trench 170. In some embodiments, the removal operation 706 can be a wet etching. The nitride layer 140, the silicon-containing layer 150, and the nitride layer 160 can be protected by the protective layer 180 from etching. Due to the selectivity, the removal operation 706 can mainly remove the silicon-containing layer 130/130a, which is exposed by the protective layer 180. The first portion 171 of the trench 170 can be expanded by etching the silicon-containing layer 130/130a. In some embodiments, the operation 706 can correspond to FIG. 2F. The details of the operation 706 are described in the paragraphs related to FIG. 2F.

In operation 707, the protective layer 180 can be removed. In some embodiments, the operation 707 can be a dry etching. The nitride layer 140, the silicon-containing layer 150, and the nitride layer 160 can be exposed by removing the protective layer 180. Due to the selectivity, the removal operation 707 can mainly remove the protective layer 180 and not affect other materials in the semiconductor structure 10. In some embodiments, the operation 707 can correspond to FIG. 2G. The details of the operation 707 are described in the paragraphs related to FIG. 2G.

In operation 708, a multilayered stack 210 of the trench capacitor 200/200a can be formed within the trench 170. The multilayered stack 210 can include conductive layers 211, 213, and 215, and dielectric layers 212 and 214. The conductive layer 211 can be disposed adjacent to the plurality of layers 100 and in contact with the substrate 110. The dielectric layer 212 can be disposed on the conductive layer 211. The intermediate conductive layer 213 can be disposed on the dielectric layer 212. The dielectric layer 214 can be disposed on the intermediate conductive layer 213. The conductive layer 215 can be disposed on the dielectric layer 214. In some embodiments, the operation 708 can correspond to FIG. 2H. The details of the operation 708 are described in the paragraphs related to FIG. 2H.

In operation 709, a contact 220 of the trench capacitor 200/200a can be disposed on the multilayered stack 210. In some embodiments, the contact 220 can be formed within the trench defined by the multilayered stack 210. In some embodiments, the operation 709 can correspond to FIG. 2I. The details of the operation 709 are described in the paragraphs related to FIG. 2I.

One aspect of the present disclosure provides a semiconductor structure. The semiconductor structure includes a substrate having a first surface, a plurality of layers disposed on the first surface of the substrate. The plurality of layers includes a first nitride layer disposed on the first surface of the substrate, a first silicon-containing layer disposed on the first nitride layer, an intermediate nitride layer disposed on the first silicon-containing layer, a second silicon-containing layer disposed on the intermediate nitride layer, and a second nitride layer disposed on the second silicon-containing layer. In addition, the semiconductor structure includes a trench capacitor penetrating the plurality of layers and in contact with the substrate. The trench capacitor has a first portion having a first lateral surface and a second portion having a second lateral surface, and the first lateral surface has a slope different from that of the second lateral surface.

Another aspect of the present disclosure provides a method for forming a semiconductor structure. The method includes providing a substrate. The method includes forming a plurality of layers on the substrate, where the plurality of layers include a first nitride layer on the substrate, a first silicon-containing layer on the first nitride layer, an intermediate layer on the first silicon-containing layer, a second silicon-containing layer on the intermediate layer, and a second nitride layer on the second silicon-containing layer. The method also includes performing a first removal operation on the plurality of layers to form a trench, which penetrates the first nitride layer, the first silicon-containing layer, the intermediate layer, the second silicon-containing layer, and the second nitride layer. The trench includes a first portion surrounded by the first silicon-containing layer and a second portion surrounded by the second silicon-containing layer. The method further includes performing a second removal operation on the plurality of layers to expand the first portion of the trench.

Another aspect of the present disclosure provides a semiconductor structure. The semiconductor structure includes a substrate, a multilayered stack disposed on the substrate. The multilayered stack includes a first nitride layer disposed on the substrate, a first silicon-containing layer disposed on the first nitride layer, an intermediate nitride layer disposed on the first silicon-containing layer, a second silicon-containing layer disposed on the intermediate nitride layer, and a second nitride layer disposed on the second silicon-containing layer. In addition, the semiconductor structure includes a trench capacitor penetrating the plurality of layers and in contact with the substrate. The trench capacitor has a first portion and a second portion. The first portion has a uniform width, and the second portion has a first width adjacent to the intermediate nitride layer and a second width adjacent to the second nitride layer. Wherein the second width is greater than the first width.

This subject disclosure provides a semiconductor structure of a memory device. In current practice, the deep trench capacitor of the semiconductor structure may result in the top width of the deep trench capacitor exceeding the bottom width. That is, the deep trench tapers from the top to the bottom, and may have limited space at the bottom portion. Such structure may lead to lower capacitance value or weak structure. The subject disclosure provides a method of protecting the upper portion of the trench so that the lower portion of the trench can be widened. As the lower portion of the trench is widened, the lower portion of the trench can have a uniform width, and the upper can have a relatively great width. Accordingly, the trench can overall have a relatively uniform width. As a result, the improved deep trench capacitor can have a larger capacitance and stable structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   a substrate;
   a multilayered stack disposed on the substrate, including:
   a first nitride layer disposed on the substrate;
   a first silicon-containing layer disposed on the first nitride layer;
   an intermediate nitride layer disposed on the first silicon-containing layer;
   a second silicon-containing layer disposed on the intermediate nitride layer; and
   a second nitride layer disposed on the second silicon-containing layer; and
   a trench capacitor penetrating the multilayered stack and in contact with the substrate, wherein the trench capacitor has a first portion and a second portion above the first portion, wherein the first portion have a uniform width, wherein the second portion have a first width adjacent to the intermediate nitride layer and a second width adjacent to the second nitride layer, and wherein the second width greater than the first width;
   wherein the first silicon-containing layer includes a first region adjacent to the first nitride layer and a second region on the first region, wherein the first region of the first silicon-containing layer has a first doping concentration, and the second region of the first silicon-containing layer has a second doping concentration different from the first doping concentration.

2. The semiconductor structure of claim 1, wherein the first portion of the trench capacitor is surrounded by the first silicon-containing layer and the second portion of the trench capacitor is surrounded by the second silicon-containing layer.

3. The semiconductor structure of claim 1, wherein the second doping concentration is greater than the first doping concentration, and the first region of the first silicon-containing layer has a thickness greater than that of the second region of the first silicon-containing layer.

4. The semiconductor structure of claim 1, wherein a ratio of a height of the trench capacitor to a width of the trench capacitor is greater than 25.

5. The semiconductor structure of claim 1, wherein the substrate includes a conductive region in contact with the trench capacitor, and the conductive region of the substrate includes tungsten (W).

6. A semiconductor structure, comprising:
   a substrate;
   a multilayered stack disposed on the substrate, including:
   a first nitride layer disposed on the substrate;
   a first silicon-containing layer disposed on the first nitride layer;
   an intermediate nitride layer disposed on the first silicon-containing layer;
   a second silicon-containing layer disposed on the intermediate nitride layer; and a second nitride layer disposed on the second silicon-containing layer; and a trench capacitor penetrating the multilayered stack and in contact with the substrate, wherein the trench capacitor has a first portion and a second portion above the first portion, wherein the first portion have a uniform width, wherein the second portion have a first width adjacent to the intermediate nitride layer and a second width adjacent to the second nitride layer, and wherein the second width greater than the first width;

wherein the first silicon-containing layer includes a material different from that of the second silicon-containing layer, and the first silicon-containing layer includes borophosphosilicate glass (BPSG) and the second silicon-containing layer includes tetraethoxysilane (TEOS).

7. A semiconductor structure, comprising:

a substrate;

a multilayered stack disposed on the substrate, including:

a first nitride layer disposed on the substrate;

a first silicon-containing layer disposed on the first nitride layer;

an intermediate nitride layer disposed on the first silicon-containing layer;

a second silicon-containing layer disposed on the intermediate nitride layer; and a second nitride layer disposed on the second silicon-containing layer; and a trench capacitor penetrating the multilayered stack and in contact with the substrate, wherein the trench capacitor has a first portion and a second portion above the first portion, wherein the first portion have a uniform width, wherein the second portion have a first width adjacent to the intermediate nitride layer and a second width adjacent to the second nitride layer, and wherein the second width greater than the first width;

wherein the trench capacitor comprises:

a first conductive layer adjacent to the multilayered stack;

a first dielectric layer disposed on the first conductive layer;

an intermediate conductive layer disposed on the first dielectric layer and in contact with the substrate;

a second dielectric layer disposed on the intermediate conductive layer; and a second conductive layer disposed on the second dielectric layer;

wherein the trench capacitor further comprises a polysilicon contact disposed on the second conductive layer.

* * * * *